(12) United States Patent
Matsuno et al.

(10) Patent No.: US 7,768,811 B2
(45) Date of Patent: Aug. 3, 2010

(54) FERROELECTRIC MEMORY APPARATUS AND CONTROL METHOD OF THE SAME

(75) Inventors: Noriaki Matsuno, Hyogo (JP); Atsuo Inoue, Kyoto (JP)

(73) Assignee: Panasonic Corporation, Osaka (JP)

( * ) Notice: Subject to any disclaimer, the term of this patent is extended or adjusted under 35 U.S.C. 154(b) by 64 days.

(21) Appl. No.: 11/854,197

(22) Filed: Sep. 12, 2007

(65) Prior Publication Data
US 2008/0068873 A1    Mar. 20, 2008

(30) Foreign Application Priority Data
Sep. 14, 2006    (JP) .............................. 2006-249940

(51) Int. Cl.
*G11C 11/22*    (2006.01)

(52) U.S. Cl. ...................... 365/145; 365/49.13; 365/65; 365/211

(58) Field of Classification Search ................. 365/145, 365/227, 226, 211, 230.06, 200, 52
See application file for complete search history.

(56) References Cited

U.S. PATENT DOCUMENTS

| | | | |
|---|---|---|---|
| 6,667,925 B2 * | 12/2003 | Kobayashi et al. .......... | 365/211 |
| 7,139,186 B2 * | 11/2006 | Shiraishi ..................... | 365/145 |
| 7,222,052 B2 * | 5/2007 | Coulson et al. ............. | 702/186 |
| 2002/0066047 A1 * | 5/2002 | Olarig et al. ................ | 713/323 |
| 2005/0219921 A1 * | 10/2005 | Yamauchi .................... | 365/200 |
| 2005/0288902 A1 * | 12/2005 | Coulson et al. ............. | 702/186 |
| 2006/0171186 A1 | 8/2006 | Yamaoka | |
| 2007/0211512 A1 * | 9/2007 | Shuto ......................... | 365/145 |

FOREIGN PATENT DOCUMENTS

JP    9 231774    9/1997
JP    2002184170    6/2002

OTHER PUBLICATIONS

English language Abstract of JP 9-231774.
English language Abstract of JP 2002-184170.

* cited by examiner

*Primary Examiner*—Pho M Luu
*Assistant Examiner*—Tha-O Bui
(74) *Attorney, Agent, or Firm*—Greenblum & Bernstein, P.L.C.

(57) ABSTRACT

The ferroelectric memory apparatus stores data, and includes: a ferroelectric memory element; a temperature sensor which detects a temperature of the apparatus; a control unit that outputs a control signal indicating a voltage, the voltage increasing as the temperature detected by the temperature sensor decreases; and a voltage generating unit that generates the voltage indicated by the control signal outputted by the control unit, and to supply the generated voltage to the ferroelectric memory element. This provides a ferroelectric memory apparatus which can recover from effects of thermal stress suffered after shipment—i.e., reduction in the polarization amount needed for data retention as well as imprint degradation—using a relatively simple configuration.

17 Claims, 15 Drawing Sheets

FERROELECTRIC MEMORY APPARATUS AND CONTROL METHOD OF THE SAME

BACKGROUND OF THE INVENTION (1) Field of the Invention

The present invention relates to a ferroelectric memory apparatus and a control method of the same.

(2) Description of the Related Art

Ferroelectric memory apparatuses are excellent non-volatile memories which feature high speed and low power consumption, and have a long cycle life. Their potential is highly valued in the multimedia society. Recently, multimedia products which incorporate a ferroelectric memory apparatus have emerged one after another, growing in number year by year.

A ferroelectric capacitor which is an essential part of the ferroelectric memory apparatus for storing information indicates zero polarization at the origin of a polarization characteristic curve, i.e., at an applied voltage of 0 in FIG. 1 when the ferroelectric capacitor is not used. For example, when a voltage which exceeds a polarization inversion voltage "VCL" is applied to the ferroelectric capacitor at low temperatures, the polarization moves, according to the applied voltage, along a characteristic curve indicated by P1, P2, P3, and P4. When the application of the voltage is stopped, data "1" and "0" are stored by maintaining two polarization states, P2 and P4.

Also, as an intrinsic property of a ferroelectric capacitor, when no voltage is applied, at high temperatures, a polarization amount P12 is smaller than a polarization amount P2 at low temperatures, hysteresis width is decreased, a polarization inversion voltage "VCH" is lower than the polarization inversion voltage "VCL" at low temperatures, and the polarization moves along a characteristic curve indicated by P1, P12, P3, and P14, as shown in FIG. 1. In this way, the polarization inversion voltage has negative temperature characteristics.

Note that FIG. 1 shows an example of inversing the polarization of a ferroelectric capacitor at a fixed voltage regardless of temperature.

A ferroelectric capacitor once exposed to high temperatures maintains its reduced polarization amount even if it is placed at low temperatures again. Its polarization moves along a characteristic curve indicated by P11, P12, P13, and P14.

If no measure is taken against such temperature dependence of ferroelectric capacitor characteristics, data cannot be written properly or data retention characteristics will be degraded, making an assured operating temperature range narrower than other non-volatile memories. It is feared that this may hinder the spread of products equipped with a ferroelectric memory apparatus.

A design technique for a ferroelectric memory element has been proposed which provides a larger read margin in a predetermined operating temperature range (see, for example, Japanese Unexamined Patent Publication 9-231774 (pp. 5-6 and FIG. 4). Also, a technique has been proposed for taking measures against manufacturing variations and the temperature dependence of ferroelectric memories by improving data retention characteristics by means of a memory cell configuration which reduces an area, an equivalent circuit, a manufacturing method, and variable control of applied voltage pulse width suitable for using ferroelectric memory elements thus manufactured (see, for example, Japanese Unexamined Patent Publication 2002-184170 (pp. 9-26 and FIGS. 1, 3, and 14).

However, the conventional techniques described above are intended to increase yields in the manufacture of ferroelectric memories which operate properly in the assured operating temperature range (0° C. to 70° C.) of typical non-volatile memories and they are effective only in designing and manufacturing ferroelectric memory elements with desirable characteristics.

Thus, if there is a request to expand the operating temperature range of a ferroelectric memory apparatus but design margins available with conventional techniques cannot accommodate the request, it is necessary to newly develop a ferroelectric memory to fulfill the request. For example, when variably controlling the width of the voltage pulses applied to the ferroelectric memory, the use of a wide temperature range results in a larger difference between maximum and minimum pulse widths accordingly. This causes access time to the ferroelectric memory apparatus to be constrained by the maximum pulse width, making it difficult to operate the ferroelectric memory apparatus reliably within a given access time and thus affecting the operation of the entire apparatus.

This problem may be solved through development of a new ferroelectric memory by the application of conventional techniques. However, that will require development cost and time. Furthermore, any change in core size or specifications of ferroelectric memory will affect the entire apparatuses on each of which the ferroelectric memory will be mounted. Thus, it is not easy to expand an operation assured range.

Furthermore, the conventional techniques described above take no measure against temperature changes or neglect after a write/read operation, causing imprint degradation which makes it difficult to rewrite data in the ferroelectric memory. Thus, the conventional techniques cannot accommodate indoor and outdoor uses in cold regions where temperatures change severely.

FIG. 2 is a polarization characteristic curve of a ferroelectric capacitor suffering from imprint degradation. As shown in FIG. 2, the imprint degradation is a state in which polarization characteristics lose symmetry with respect to an applied voltage. As the imprint degradation progresses, it becomes difficult to rewrite information.

Incidentally, when the ferroelectric memory apparatuses are manufactured, there may be cases in which accelerated stress testing is conducted prior to shipment to artificially subject the ferroelectric memory apparatus to stressful conditions which cause some imprint degradation.

An example of a configuration for such testing is shown in FIG. 3. An external inspection system (not shown) applies voltage from a PAD 101 to accelerate various stressful conditions for a ferroelectric memory element 1 and a control unit 100 supplies the applied voltage to the ferroelectric memory element 1 and thereby accesses the ferroelectric memory element 1. Such access is performed, for example, by gradually changing time for which a voltage is applied, by performing write and read operations in various combinations, by continuing access for a long time, or the like.

After screening the ferroelectric memory apparatuses based on whether the degradation of characteristics falls within an allowable range, the external inspection system applies, to the screened conforming apparatuses, a voltage used for the characteristic recovery and polarization elimination, from the PAD 101, and thereby makes the ferroelectric memory element 1 recover from the degradation caused by the accelerated stress testing. Thus, the degradation of characteristics caused by the accelerated stress testing is eliminated in shipped products.

However, there is no conventional technique for making products recover from degradation of characteristics caused by thermal stress suffered after shipment.

SUMMARY OF THE INVENTION

In view of the above problems, the present invention has an object to provide a ferroelectric memory apparatus which can recover from effects of thermal stress suffered after shipment—i.e., reduction in the polarization amount needed for data retention as well as imprint degradation—using a relatively simple configuration.

In order to solve the aforementioned problems, the ferroelectric memory apparatus according to the present invention is a ferroelectric memory apparatus which stores data, and the apparatus includes: a ferroelectric memory element; a temperature sensor which detects a temperature of the apparatus; a control unit that outputs a control signal indicating a voltage, the voltage increasing as the temperature detected by the temperature sensor decreases; and a voltage generating unit that generates the voltage indicated by the control signal outputted by the control unit and that supplies the generated voltage to the ferroelectric memory element.

It is possible that the control unit controls the voltage generating unit so as to generate a voltage which varies in a stepwise manner according to a variation of the temperature detected by the temperature sensor, and controls the voltage generating unit so as to vary the generated voltage only when the temperature sensor detects a temperature that exceeds a temperature range within which data can be accurately written into and read from the ferroelectric memory element using a fixed voltage.

Consequently, it is possible to variably control the voltage generating unit so as to provide negative temperature characteristics of an optimal voltage to be applied to the ferroelectric memory element during a data write or read operation based on temperature measurements by the temperature sensor, and thereby to recover from degradation of data retention characteristics and imprint degradation by supplying the voltage in order for the ferroelectric memory element to perform a data write or read operation.

Also, it is possible to provide a ferroelectric memory apparatus which operates properly even in environments outside a conventional assured operating temperature range by simply adding, to a conventional ferroelectric memory apparatus, a configuration which controls the voltage applied to a ferroelectric memory element according to temperature without making changes to the ferroelectric memory element itself or newly developing a ferroelectric memory element.

Furthermore, it is desirable that the ferroelectric memory element includes a ferroelectric capacitor and a transistor, and the voltage generating unit applies the generated voltage to the ferroelectric capacitor via the transistor as an operating voltage for writing and reading data, and generates a control voltage for controlling the transistor so as to supply the control voltage to the transistor.

Consequently, when the transistor is connected between a bit line and the ferroelectric capacitor and an operating voltage given to the bit line is configured to be applied to the ferroelectric capacitor according to a control voltage given to the word line, it is possible to apply a desired operating voltage accurately to the ferroelectric capacitor by applying a control voltage which can compensate for drops in the operating voltage caused by the transistor to a word line.

Preferably, it is possible that the ferroelectric memory apparatus further includes a rewrite control unit that performs, in the ferroelectric memory element, a rewrite control during a period when neither a write operation nor a read operation of data is performed according to a command issued from outside the ferroelectric memory apparatus, the rewrite control being reading of the data from the ferroelectric memory element and then rewriting of the read data into the ferroelectric memory element.

Consequently, it is possible to recover from degradation of data retention characteristics and imprint degradation by rewriting data during a non-access time of the ferroelectric memory element based on current results of measurements taken by the temperature sensor.

Preferably, it is possible that the rewrite control unit stores a threshold value of the temperatures detected by the temperature sensor and voltage values corresponding to the temperatures, and indicates, to the voltage generating unit, a voltage value which is stored and corresponds to a temperature to be detected after the temperature detected by the temperature sensor exceeds the stored threshold value and varies, and the voltage generating unit supplies, to the ferroelectric memory element, the voltage generated according to an indication from the rewrite control unit as an operating voltage for rewriting data.

Consequently, it is possible to efficiently recover from degradation of data retention characteristics and imprint degradation only when the threshold temperature is exceeded.

Preferably, it is possible that the ferroelectric memory apparatus further includes a condensation sensor which detects condensation occurring from the ferroelectric memory apparatus, and the rewrite control unit performs rewrite control when the condensation sensor detects the condensation.

Consequently, since a rewrite operation can be performed only when temperature changes greatly, it is possible to efficiently recover from degradation of data retention characteristics and imprint degradation.

It is possible that the ferroelectric memory apparatus further includes plural ferroelectric memory elements, further: a storage unit which stores the temperature detected by the temperature sensor and an address that identifies one of the ferroelectric memory elements in which the data has been written and read, when the data is written into and read from one of the plural ferroelectric memory elements; and a comparison judging unit that compares a difference between a temperature newly detected by the temperature sensor and the temperature stored in the storage unit, and judges whether the difference of the temperatures exceeds a predetermined value; and the rewrite control unit performs rewrite control on the data stored in the ferroelectric memory element identified by the address stored in the storage unit, when the comparison judging unit judges that the difference exceeds the predetermined value.

Consequently, since data is rewritten into only the ferroelectric memory element considered to be suffering from degradation of data retention characteristics and imprint degradation so as to recover from degradation of data retention characteristics and imprint degradation, it is possible to avoid a negative effect that shortens the life of ferroelectric memory elements by unnecessary rewrite operations.

It is possible that the ferroelectric memory apparatus further includes: plural ferroelectric memory elements; a time measuring unit; a product-sum operation unit that calculates a product-sum of times measured by the time measuring unit and temperatures detected by the temperature sensor; and a relocating unit that reads data from at least one of the ferroelectric memory elements after the product-sum operation unit calculates the product-sum which exceeds a predetermined value and that writes the read data into one of the ferroelectric memory elements which is not used.

Consequently, when the product-sum of the measurement results obtained through temperature measurements with the temperature sensor and time measurements with the time measuring unit exceeds a predetermined threshold, it can be considered that degradation of data retention characteristics or imprint degradation has occurred in the ferroelectric memory element and the data stored in the ferroelectric memory element can be stored in another unused ferroelectric memory element considered to be free of degradation.

Preferably, it is possible that the ferroelectric memory apparatus further includes a polarization eliminating unit that eliminates a polarization amount in the ferroelectric memory element in which the data has been read, after the relocating unit executes reading of the data and writing of the read data.

Consequently, it is possible to reset the ferroelectric memory element considered to be suffering from degradation of characteristics to an unused state by eliminating its polarization and making it available as a data relocation destination again.

It is possible that the ferroelectric memory apparatus further includes a random number generating unit, wherein the relocating unit determines, based on a random number generated by the random number generating unit, one of the ferroelectric memory elements into which the data is to be written, and writes the data into the ferroelectric memory element which has been determined by the relocating unit.

Consequently, since the ferroelectric memory element for use as a relocation destination is determined using a random number, it is possible to avoid a situation in which a particular ferroelectric memory element would be used as a relocation destination with high frequency, constraining the life of the entire ferroelectric memory apparatus in terms of the number of rewrites.

It is possible that the ferroelectric memory apparatus further includes: a time measuring unit; a product-sum operation unit that calculates a product-sum of time measured by the time measuring unit and the temperature detected by the temperature sensor; and a data inversion writing unit that reads data from the ferroelectric memory element after the product-sum operation unit calculates the product-sum which exceeds a predetermined value, and performs inversion writing control which inverts the read data and writes the data into the ferroelectric memory element.

Consequently, it is possible to recover from degradation of data retention characteristics and imprint degradation using only a single ferroelectric memory element without providing a redundant ferroelectric memory element.

Preferably, it is possible that the product-sum operation unit calculates a voltage and time that should be supplied to the ferroelectric memory element so as to cancel, under the temperature detected by the temperature sensor, a variation of a characteristic which is assumed to occur in the ferroelectric memory element according to the calculated product-sum of the time and temperature, when the data inversion writing unit performs inversion writing control on the data, and the control unit controls the voltage generating unit so as to supply the voltage calculated by the product-sum operation unit to the ferroelectric memory element for the calculated time.

Consequently, since the voltage and time period can be supplied to the ferroelectric memory element once or in the minimum number of times, resulting in a smaller number of inverted-data writes so as to recover from degradation of characteristics, it is possible to extend the life of the ferroelectric memory element.

Preferably, it is possible that the ferroelectric memory apparatus further includes an other ferroelectric memory element which stores indication data, wherein the data inversion writing unit performs the inversion writing control, reads the indication data from the other ferroelectric memory element, inverses the read indication data, and writes the data into the other ferroelectric memory element, and the ferroelectric memory apparatus further includes a read judging unit that reads the data from the ferroelectric memory element, reads the indication data from the other ferroelectric memory element, judges whether or not the data is inversed based on the indication data, and inverses the read data or outputs the read data outside the ferroelectric memory apparatus without inversing the data, depending on a result of the judgment.

Consequently, even when the inverted data is retained in the ferroelectric memory element so as to recover from degradation of data retention characteristics and imprint degradation, it is possible to respond right data in response to an external read request.

Preferably, it is possible that the ferroelectric memory apparatus further includes: an auxiliary power supply which is a battery; and a power switch unit that supplies an operating power of the ferroelectric memory apparatus from the auxiliary power supply, when power is not supplied from outside the ferroelectric memory apparatus.

Consequently, by operating the ferroelectric memory apparatus on the auxiliary power supply, it is possible to recover from degradation of data retention characteristics and imprint degradation caused by long-term neglect during storage or the like.

It is possible that the ferroelectric memory apparatus further includes a mode judging unit that judges whether the ferroelectric memory apparatus is operated in a first mode or a second mode according to a command issued from outside the ferroelectric memory apparatus, wherein the control unit controls the voltage generating unit so as to generate a voltage according to the temperature detected by the temperature sensor when the mode judging unit judges the first mode, and so as to generate a voltage having a predetermined fixed value when the mode judging unit judges the second mode.

Consequently, it is possible to control, according to external commands, an operation so as to recover from degradation of data retention characteristics and imprint degradation.

Note that when the ferroelectric memory element and the voltage generating unit are formed on a semiconductor memory chip, the control unit may be implemented as a function performed by a microcomputer which accesses the semiconductor memory chip.

This configuration makes it possible to reduce a circuit scale on the semiconductor memory chip.

Furthermore, the present invention can be implemented not only as the ferroelectric memory apparatus described above, but also as a control method for the ferroelectric memory apparatus.

The ferroelectric memory apparatus according to the present invention generates a voltage with temperature characteristics suitable for application to the ferroelectric memory element for a data write or read operation based on temperature measurements by the temperature sensor and supplies the voltage in order for the ferroelectric memory element to perform a data write or read operation. This makes it possible to recover from degradation of data retention characteristics and imprint degradation caused by thermal stress suffered after shipment.

FURTHER INFORMATION ABOUT TECHNICAL BACKGROUND TO THIS APPLICATION

The disclosure of Japanese Patent Application No. 2006-249940 filed on Sep. 14, 2006 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Figure 1:
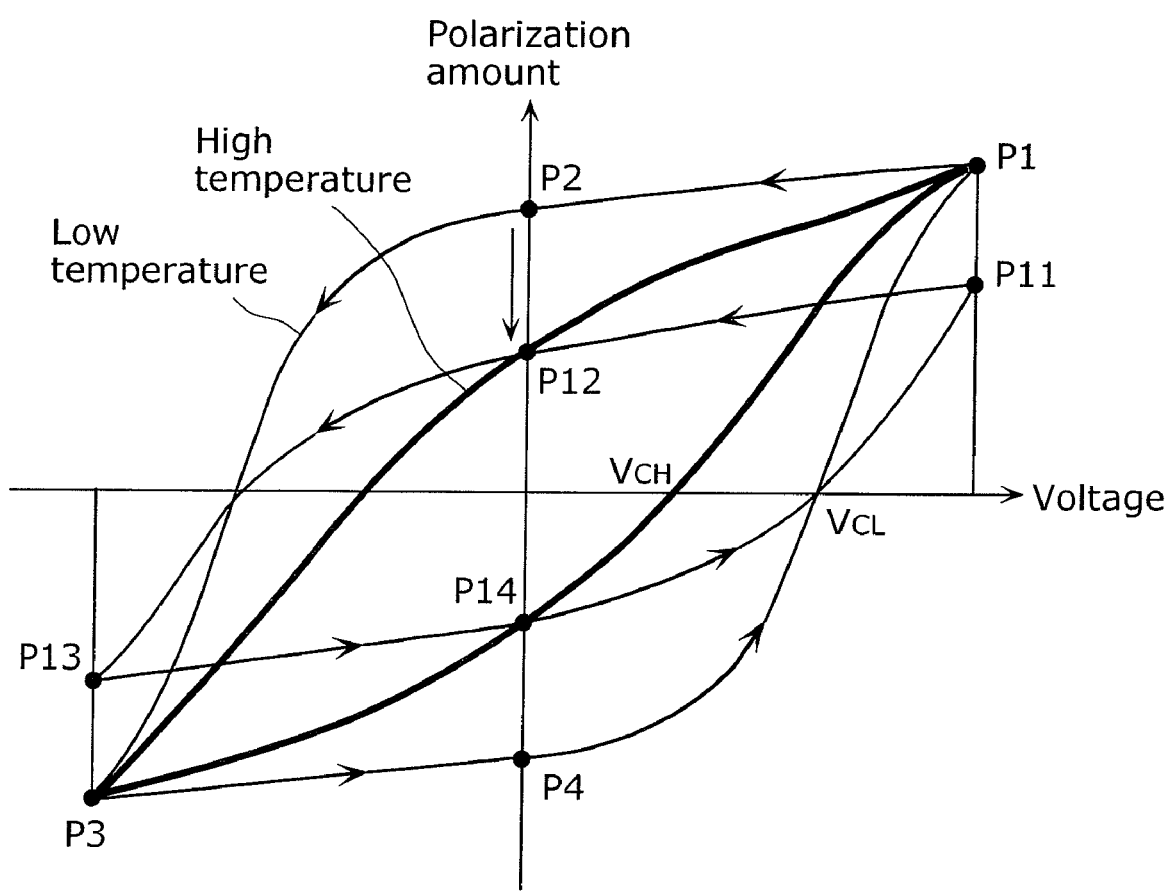
FIG. 1 is a polarization characteristic curve when a typical ferroelectric capacitor is controlled at a fixed voltage.
Figure 2:
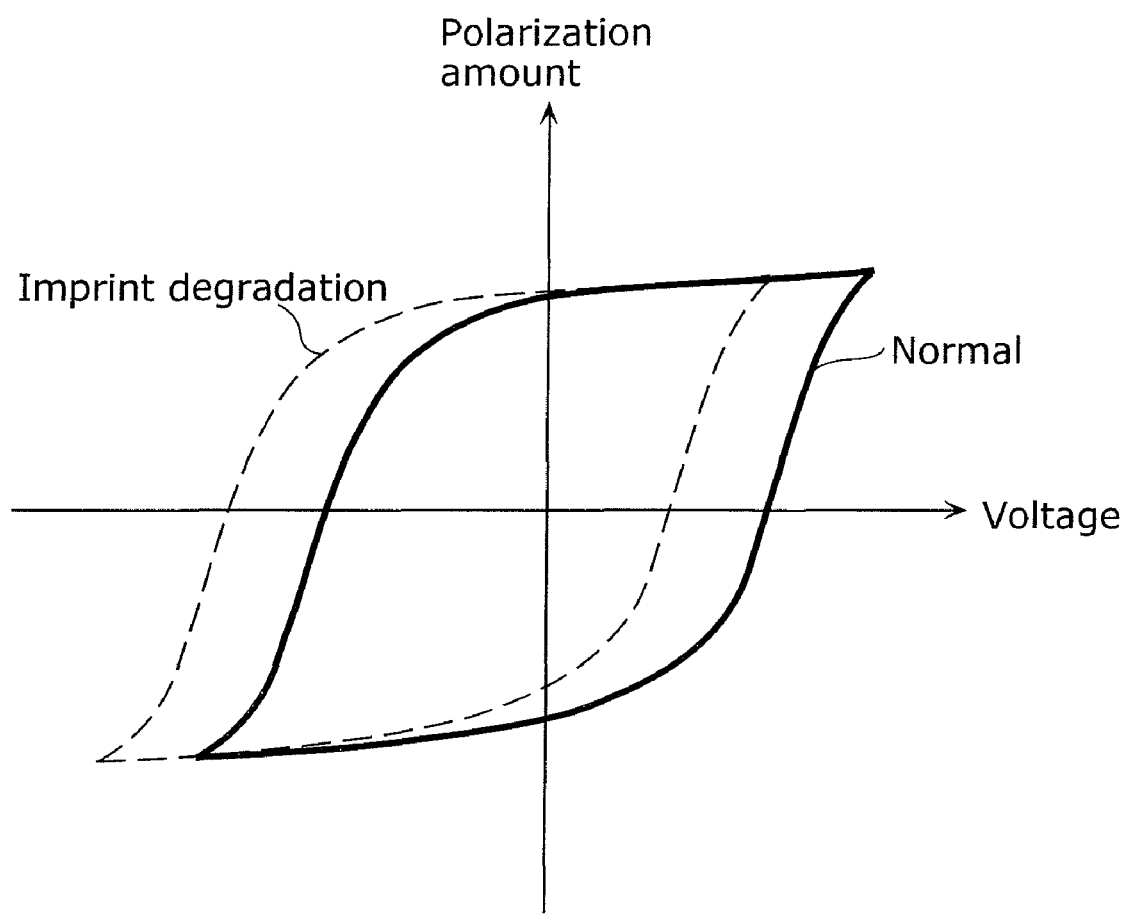
FIG. 2 is a polarization characteristic curve of a ferroelectric capacitor suffering from imprint degradation.
Figure 3:
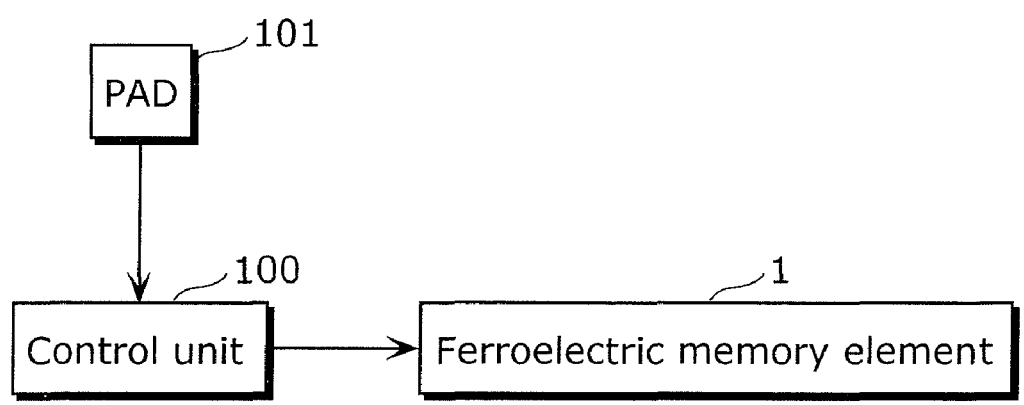
FIG. 3 is a simplified block diagram showing a configuration often used for inspection of a conventional ferroelectric memory apparatus.

The best mode for carrying out the present invention will be described below with reference to the drawings. Incidentally, the same components will be denoted by the same reference numerals in different drawings and redundant description thereof will be omitted.

First Embodiment

Figure 4:
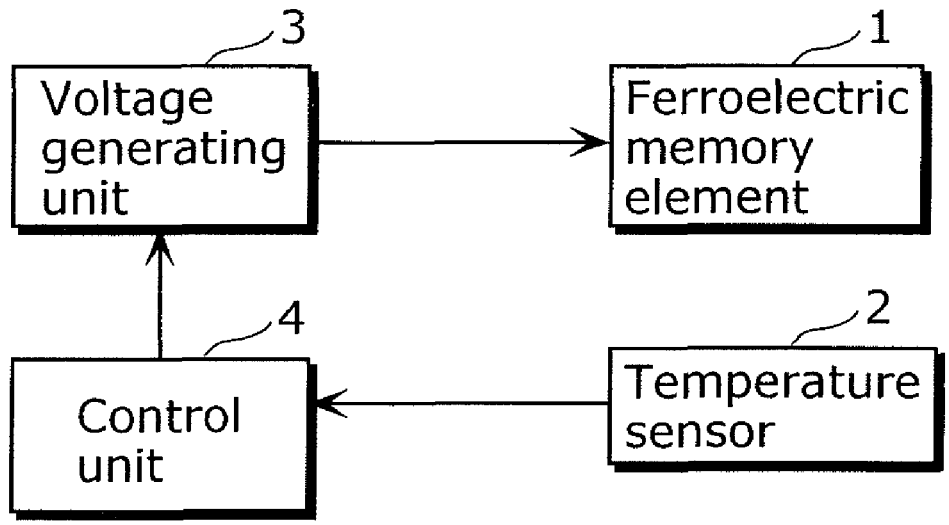
FIG. 4 is a block diagram of a ferroelectric memory apparatus according to a first embodiment.

FIG. 4 is a block diagram showing an example of functional configuration of a ferroelectric memory apparatus according to a first embodiment. The ferroelectric memory apparatus includes a ferroelectric memory element 1, a temperature sensor 2, a voltage generating unit 3 which generates a voltage to be applied to a ferroelectric capacitor in a memory cell of the ferroelectric memory element 1 during a write or read operation of the ferroelectric memory element 1, and a control unit 4 which variably controls a voltage value of the voltage generating unit 3 based on measurement results produced by the temperature sensor 2.

Next, operation of the present embodiment will be described. Temperature of the ferroelectric memory apparatus is measured by the temperature sensor 2 and results of the measurement are passed to the control unit 4. The control unit 4 outputs a control signal which indicates an optimal applied voltage for a write or read operation at current temperature. Then, the voltage generating unit 3 generates the voltage indicated by the control signal. The voltage is supplied to the ferroelectric memory element 1 and applied to the ferroelectric capacitor in the memory cell of the ferroelectric memory element 1 for the write or read operation. This makes it possible to write or read data reliably and improve data retention characteristics and imprint degradation characteristics.

The voltage generating unit 3 is, for example, a voltage follower circuit and may be supplied with the voltage to be generated by itself from the control unit 4 as the control signal. Alternatively, the voltage generating unit 3 is, for example, a ladder resistor circuit and may be supplied with a digital signal as the control signal from the control unit 4, the digital signal representing voltages to be applied to individual resistors contained in the voltage generating unit 3 to obtain a desirable voltage.

Figure 5:
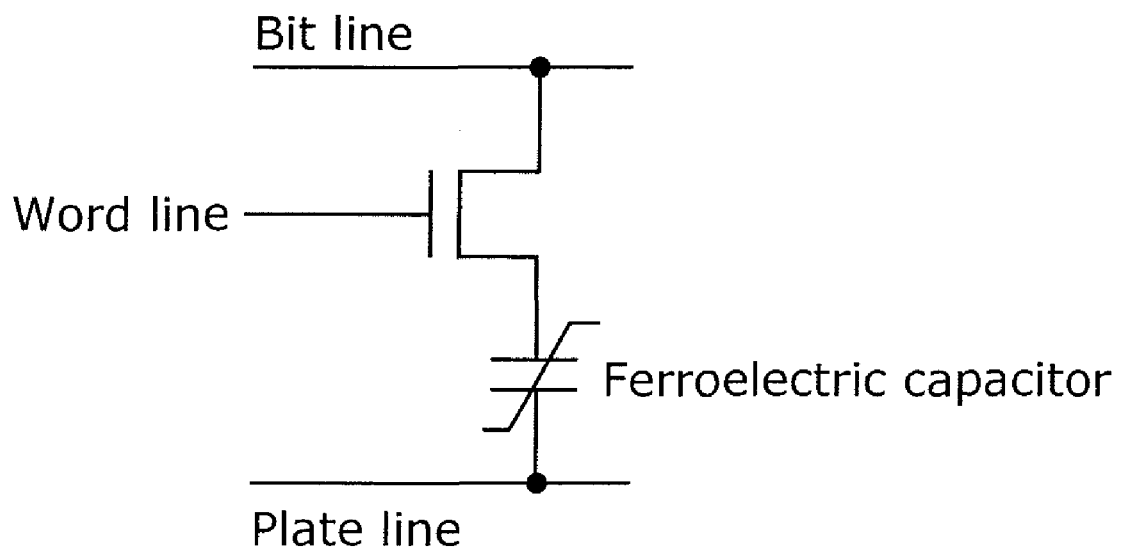
FIG. 5 is a diagram showing an equivalent circuit of a typical ferroelectric memory cell.

FIG. 5 is a diagram showing a simple equivalent circuit of a typical ferroelectric memory element. A drain of a transistor is connected to a ferroelectric capacitor, a source of the transistor is connected to a bit line, and a gate of the transistor is connected to a word line. Another end of the ferroelectric capacitor is connected to a plate line. The voltage generated by the voltage generating unit 3 is applied to the bit line and plate line and is applied to the ferroelectric capacitor via the transistor.

As described in BACKGROUND OF THE INVENTION, the ferroelectric capacitor used in ferroelectric memory apparatus generally has polarization characteristics such as shown in FIG. 1. With decreases in temperature, coercive voltage increases to VCL. A high voltage is required for a sufficient write or read operation. On the other hand, the coercive voltage decreases to VCH with increases in the temperature, making it possible to perform a write or read operation at a low voltage, but application of excessive voltage will cause imprint degradation.

Figure 6A:
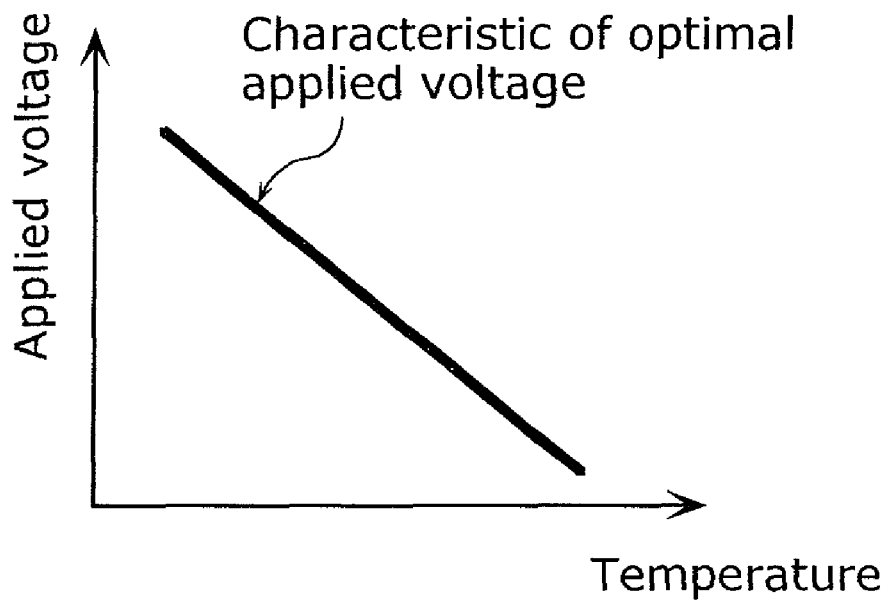
FIGS. 6A and 6B are schematic diagrams showing temperature characteristics of an optimal voltage to be applied to a ferroelectric capacitor.

Thus, unless data is written or read using an appropriate voltage, they cannot be written or read sufficiently, resulting in degradation of data retention characteristics. Therefore, an optimal voltage applied to the ferroelectric capacitor of a typical ferroelectric memory tends to have negative temperature characteristics such as shown in FIG. 6A.

Figure 6B:
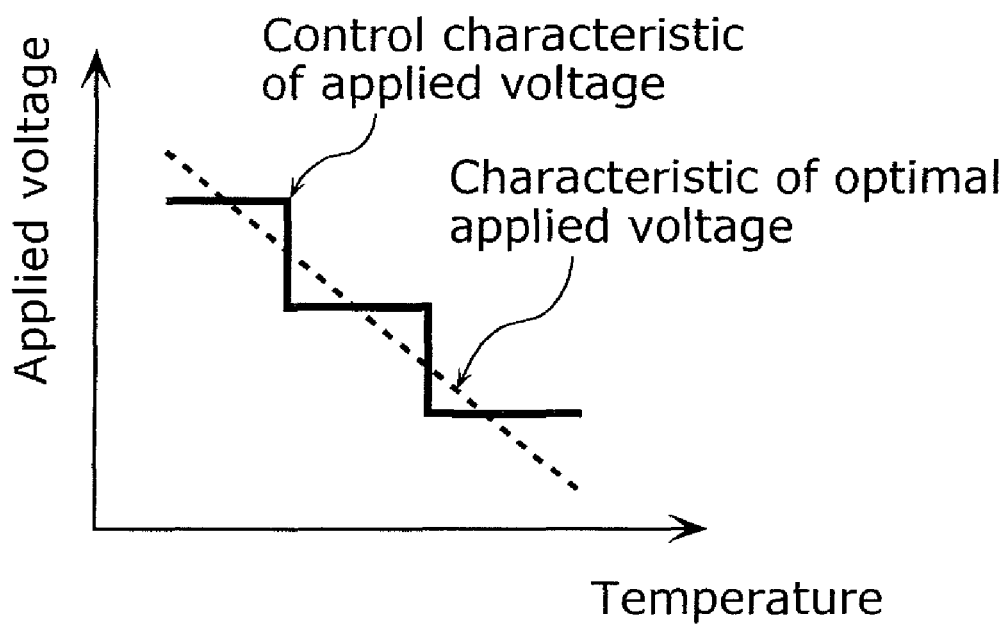

Also, as shown in FIG. 6B, a threshold temperature may be set according to an allowable temperature range in terms of data retention characteristics and imprint degradation and the voltage value may be controlled variably in a stepwise manner at or above the threshold temperature. This will make it easier to configure the voltage generating unit 3 and control unit 4.

Furthermore, the control unit 4 may variably control the voltage according to the temperature only when a temperature value out of an assured operating temperature range is detected by the temperature sensor 2 in normal control operation (which means conventional operation at a fixed voltage regardless of temperature) of the ferroelectric memory element 1.

Also, the ferroelectric memory apparatus according to the present embodiment can be implemented easily at low cost by simply adding a component which variably controls the voltage is value applied to the ferroelectric capacitor of the ferroelectric memory element 1 to a conventional ferroelectric memory apparatus without making changes to the ferroelectric memory element 1 or developing a new ferroelectric memory element.

Figure 7:
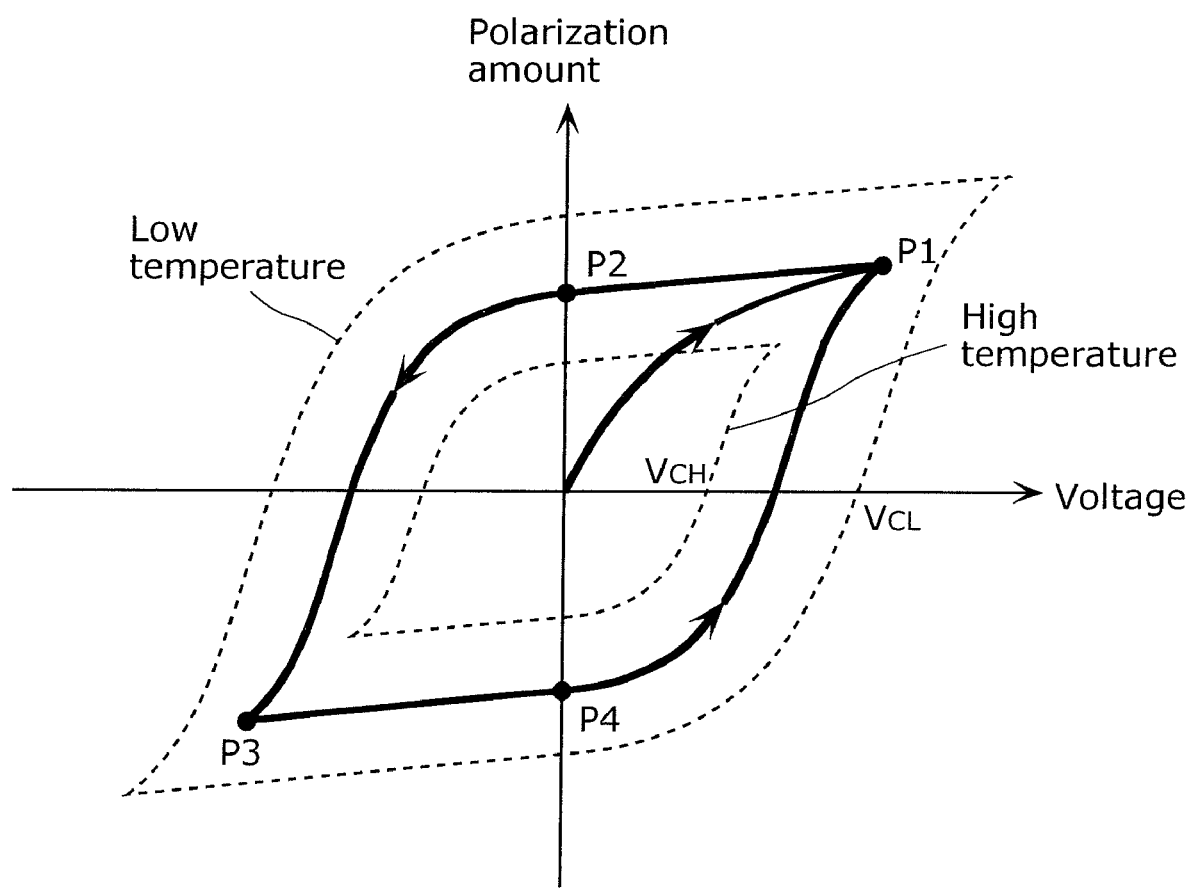
FIG. 7 is a polarization characteristic curve of a ferroelectric capacitor when voltage control is performed according to temperature.

FIG. 7 is a diagram showing a polarization characteristics of a ferroelectric capacitor when a ferroelectric memory element is controlled by a voltage which has negative temperature characteristics.

Thus, the present embodiment can provide a ferroelectric memory apparatus which operates properly even in environments out of an assured operating temperature range as well as a control method for the ferroelectric memory apparatus because the ferroelectric memory apparatus can be recovered from degradation of data retention characteristics and imprint degradation by reading and writing data using a ferroelectric memory element at a suitable voltage according to temperature.

Application of First Embodiment

Figure 8:
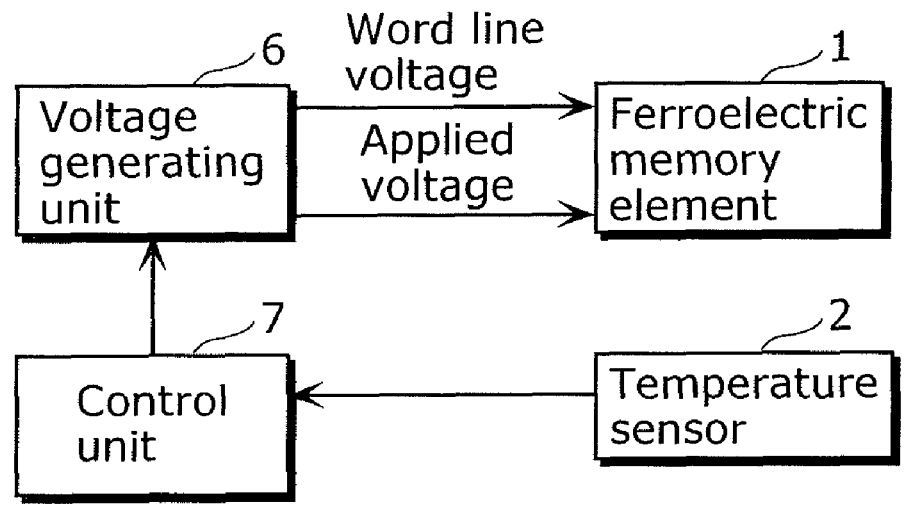
FIG. 8 is a block diagram of a ferroelectric memory apparatus according to an application of the first embodiment.

FIG. 8 is a block diagram showing a configuration of a ferroelectric memory apparatus according to an application of the first embodiment.

Compared to the configuration according to the first embodiment, the configuration according to the present application includes a voltage generating unit 6 instead of the voltage generating unit 3 and a control unit 7 instead of the control unit 4, where the voltage generating unit 6 generates a word line voltage and a voltage to be applied to the ferroelectric capacitor while the control unit 7 variably controls values of the two voltages generated by the voltage generating unit 6, according to temperature.

Next, with reference to the configuration of the present application, operation of the present application will be described regarding only differences from the first embodiment. Both optimal write or read voltage at current temperature and optimal voltage to be applied to the word line are generated by the voltage generating unit 6, supplied to the ferroelectric memory element 1, and applied to the word line and ferroelectric capacitor to perform a write or read operation.

Referring to FIG. 7 again, by increasing potential of the word line by a voltage Vt of the transistor over write potential of the bit line, it is possible to apply the voltage of the bit line to the ferroelectric capacitor without loss. Specifically, since an optimal voltage can be applied to the ferroelectric capacitor accurately by making the voltage generating unit 6 generate a word line voltage equal to an optimal write voltage applied at the current temperature plus a voltage drop across the transistor, it is possible to more efficiently recover from degradation of data retention characteristics and imprint degradation.

Thus, the present application can provide a ferroelectric memory apparatus which more properly solves the degradation of data retention characteristics and imprint degradation of a ferroelectric memory and operates properly even in environments out of an assured operating temperature range as well as provide a control method for the ferroelectric memory apparatus.

Second Embodiment

Figure 9:
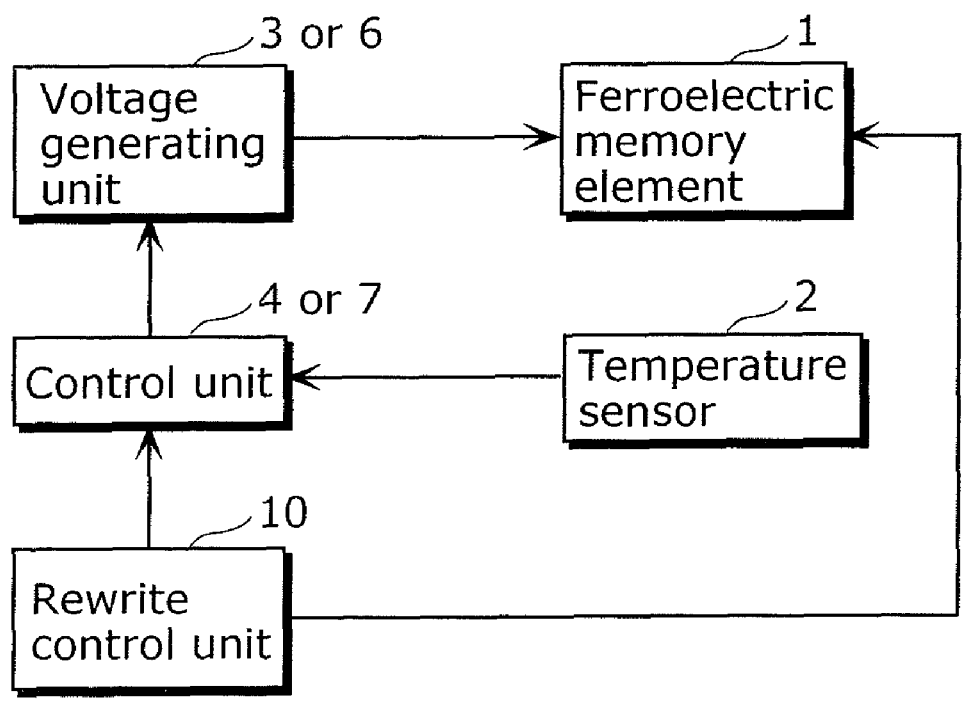
FIG. 9 is a block diagram of a ferroelectric memory apparatus according to a second embodiment.

FIG. 9 is a block diagram showing a configuration of a ferroelectric memory apparatus according to a second embodiment.

Compared to the configuration according to the first embodiment and application of the first embodiment, the configuration according to the present embodiment further includes a rewrite control unit 10 which reads data from the ferroelectric memory element 1 and writes the data again.

Next, with reference to the configuration of the present embodiment, operation of the present embodiment will be described regarding only differences from the first embodiment. Using a non-access time of the ferroelectric memory element 1, the rewrite control unit 10 forcibly rewrites information in the ferroelectric memory element 1 in order. In performing the rewrite operation, an optimal write voltage at the temperature during the rewrite operation is generated with the control unit 4 or 7 variably controlling the voltage generating unit 3 or 6.

This makes it possible to recover from degradation of data retention characteristics and imprint degradation when the temperature changes after a write or read operation regardless of whether or not there is an access request from outside the ferroelectric memory apparatus.

Also, the ferroelectric memory apparatus according to the present embodiment can be implemented easily at low cost by simply adding a component which controls data rewrite operations to the ferroelectric memory apparatus according to the first embodiment or application of the first embodiment without making changes to the ferroelectric memory element 1 or developing a new ferroelectric memory element.

The optimal write voltage at the temperature during the data rewrite operation may be higher than the voltage used for initial data write operations at the same temperature.

Figure 10:
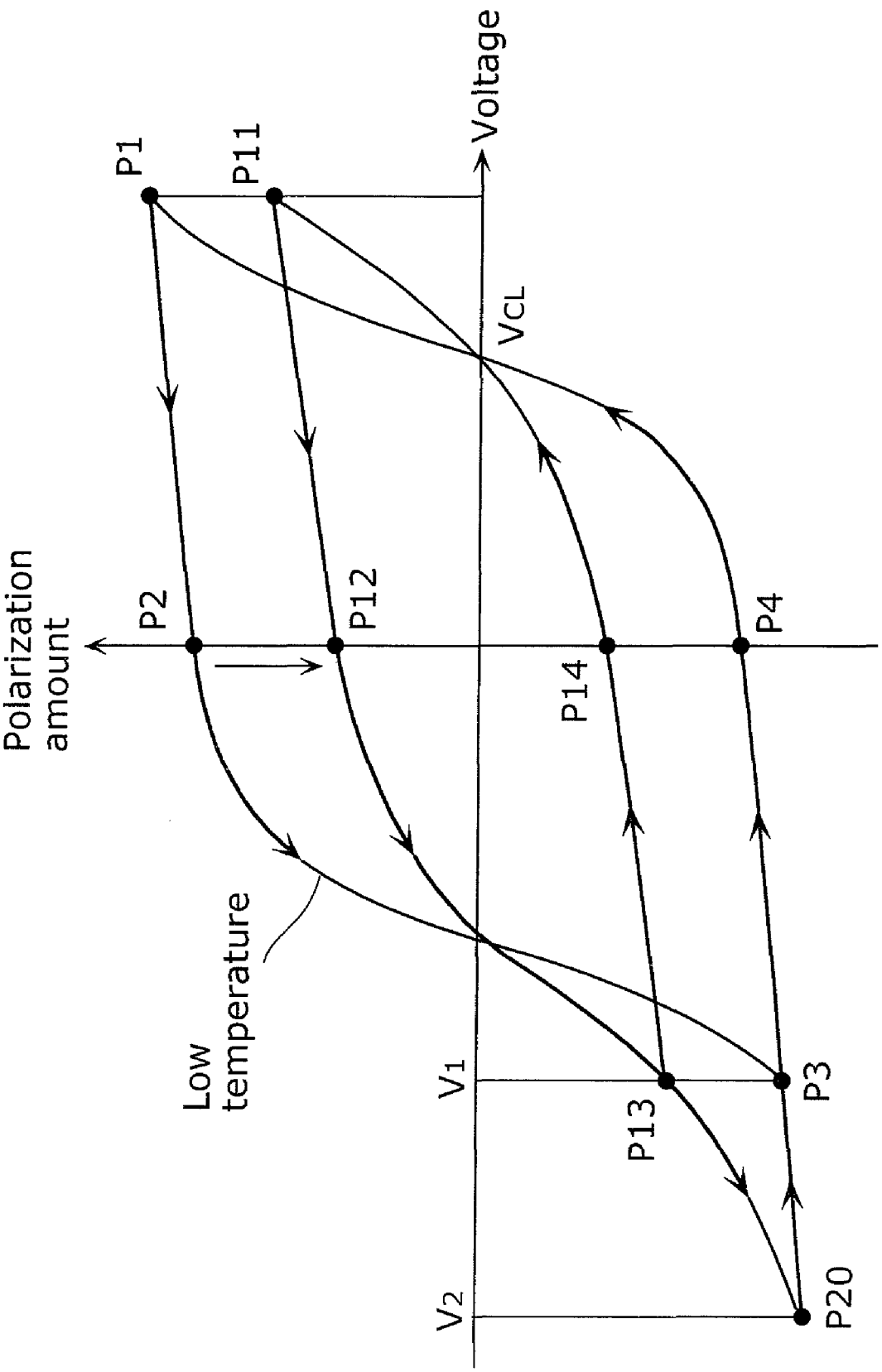
FIG. 10 is a polarization characteristic curve for illustrating the recovery of data retention characteristics.

FIG. 10 is a diagram for illustrating how the data retention characteristics of a ferroelectric capacitor can be restored by writing data using such a voltage.

As described in BACKGROUND OF THE INVENTION, a ferroelectric capacitor once exposed to high temperatures maintains its reduced polarization amount, i.e., degraded data retention characteristics, even if it is placed at low temperatures again. As an example of an operation so as to recover from such a state, by rewriting data at a higher voltage V2 than a voltage V1 used for data write operations at low temperatures and thereby causing polarization P20 in the ferroelectric capacitor, it is possible to regain a desirable characteristic curve indicated by P1, P2, P3, and P4 and obtained at low temperatures.

Thus, the present embodiment provides a ferroelectric memory apparatus which can recover the ferroelectric memory from degradation of characteristics and operate properly even in cold regions or in environments with severe temperature changes as well as provides a control method for the ferroelectric memory apparatus.

First Application of Second Embodiment

Figure 11:
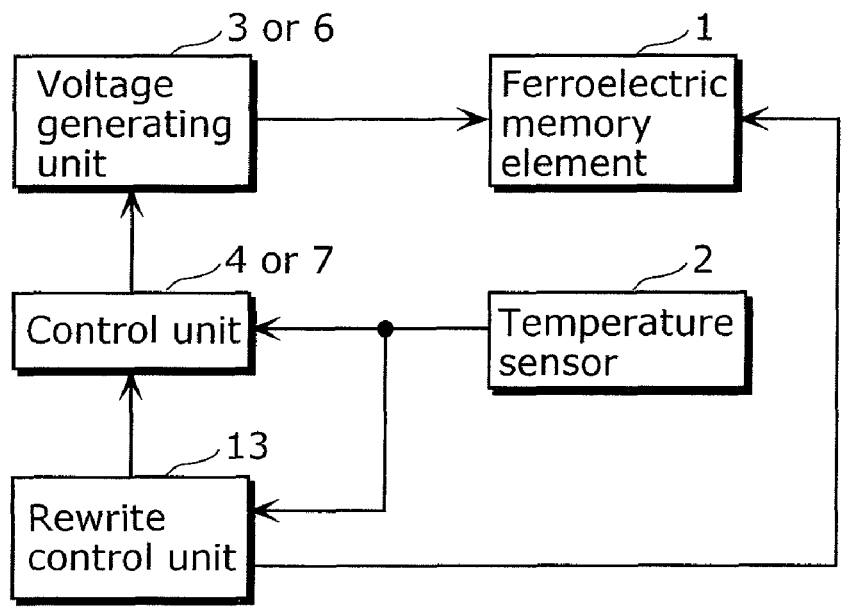
FIG. 11 is a block diagram of a ferroelectric memory apparatus according to a first application of the second embodiment.

FIG. 11 is a block diagram showing a configuration of a ferroelectric memory apparatus according to a first application of the second embodiment.

Compared to the configuration according to the second embodiment, the configuration according to the present application includes a rewrite control unit 13 which performs a rewrite operation based on temperature measurement results produced by the temperature sensor 2.

Next, with reference to the configuration of the present application, an operation of the present application will be described regarding only differences from the second embodiment.

Figure 12:
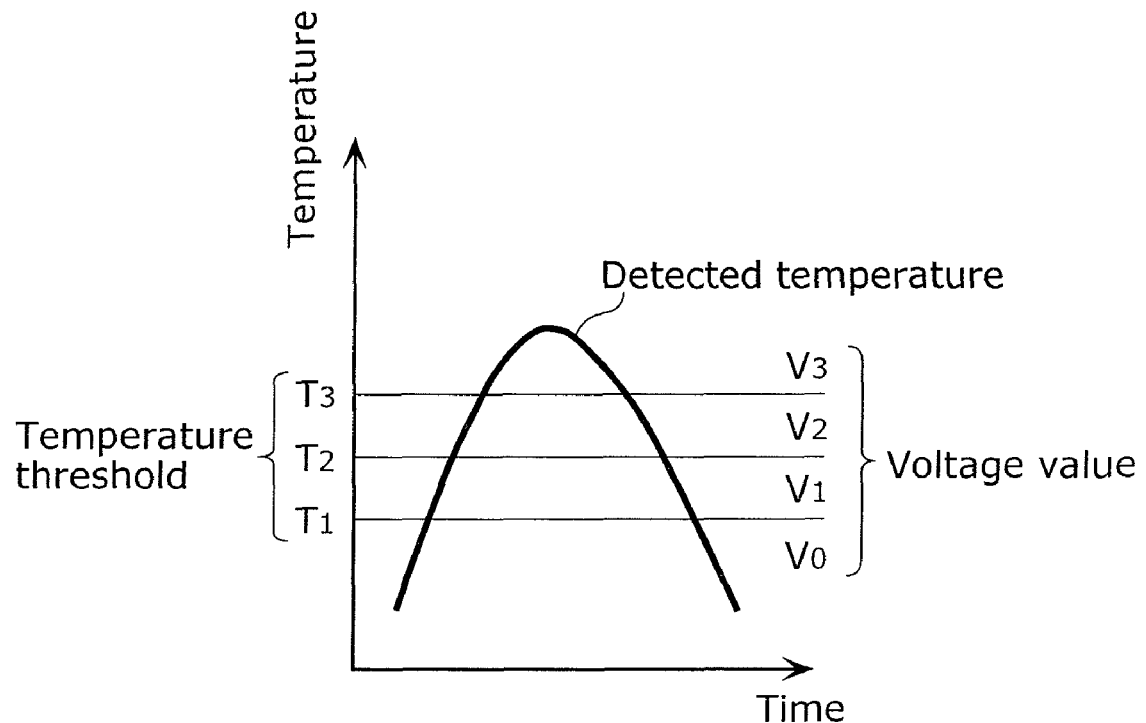
FIG. 12 is a schematic diagram showing temperature threshold setting for rewrite voltage.

As shown in FIG. 12, a temperature threshold for use to recover the ferroelectric capacitor from degradation of characteristics is set for the temperature detected by the temperature sensor 2. When the temperature detected by the temperature sensor 2 exceeds the temperature threshold, the rewrite control unit 13 forcibly rewrites information in the ferroelectric memory element 1 in order using the optimal write voltage at the temperature at that time. This makes it possible to efficiently recover from degradation of data retention characteristics and imprint degradation and simplify equipment control.

Moreover, as described above, it is preferable that when the temperature makes downward changes, the write voltage used for a data rewrite operation is higher than the voltage used for regular data write operations at the same temperature.

Thus, since the present application can recover the ferroelectric memory from degradation of characteristics using a simple configuration, it provides a ferroelectric memory apparatus which can operate properly even in cold regions or in environments with severe temperature changes range as well as provides a control method for the ferroelectric memory apparatus.

Second Application of Second Embodiment

Figure 13:
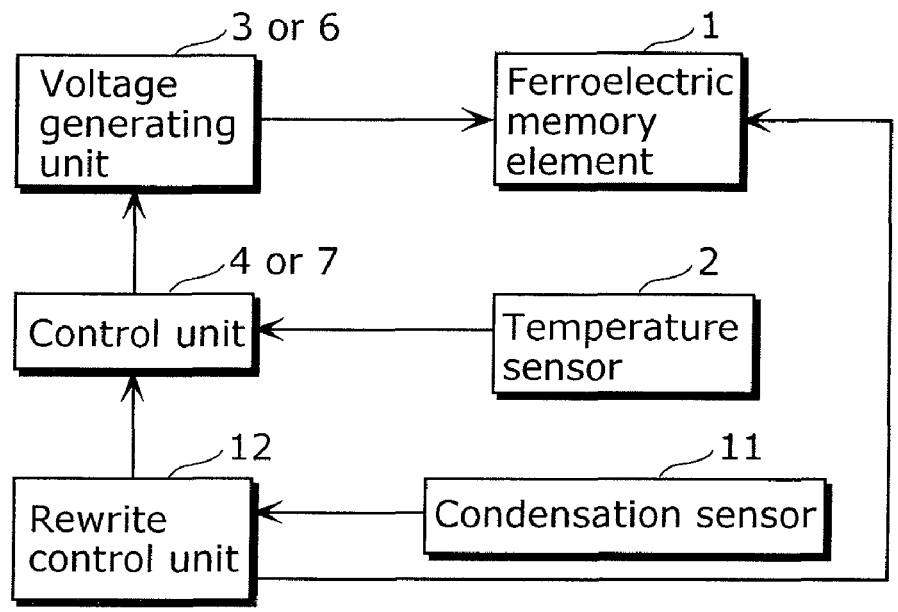
FIG. 13 is a block diagram of a ferroelectric memory apparatus according to a second application of the second embodiment.

FIG. 13 is a block diagram showing a configuration of a ferroelectric memory apparatus according to a second application of the second embodiment.

Compared to the configuration according to the second embodiment, the configuration according to the present application includes a condensation sensor 11 and a rewrite control unit 12 which performs a rewrite operation based on results produced by the condensation sensor 11.

Next, with reference to the configuration of the present application, an operation of the present application will be described regarding only differences from the second embodiment. When the condensation sensor 11 detects condensation, a detected flag is set in the rewrite control unit 12. When the condensation disappears, the rewrite control unit 12 forcibly rewrites information in the ferroelectric memory element 1 in order using a non-access time of the ferroelectric memory element 1. When the rewrite operation is finished, the flag in the rewrite control unit 12 is turned off. Rewriting operations are performed only when the flag is set in the rewrite control unit 12 as a result of detection by the condensation sensor 11.

Condensation occurs only as a result of sudden temperature changes which generally facilitate imprint degradation of the ferroelectric memory element 1 without fail. Thus, by detecting sudden temperature changes based on condensation and performing a rewrite operation using the optimal write voltage at the current temperature when the temperature stabilizes, it is possible to efficiently recover from degradation of data retention characteristics and the imprint degradation. Also, the present application can provide an apparatus easily at low cost by simply adding the condensation sensor 11 to the second embodiment without making changes to the ferroelectric memory element 1 or developing a new ferroelectric memory element.

Thus, since the present application can recover the ferroelectric memory from degradation of data retention characteristics and imprint degradation, it provides a ferroelectric memory apparatus which can operate properly even in cold regions or in environments with severe temperature changes as well as provides a control method for the ferroelectric memory apparatus.

Third Embodiment

Figure 14:
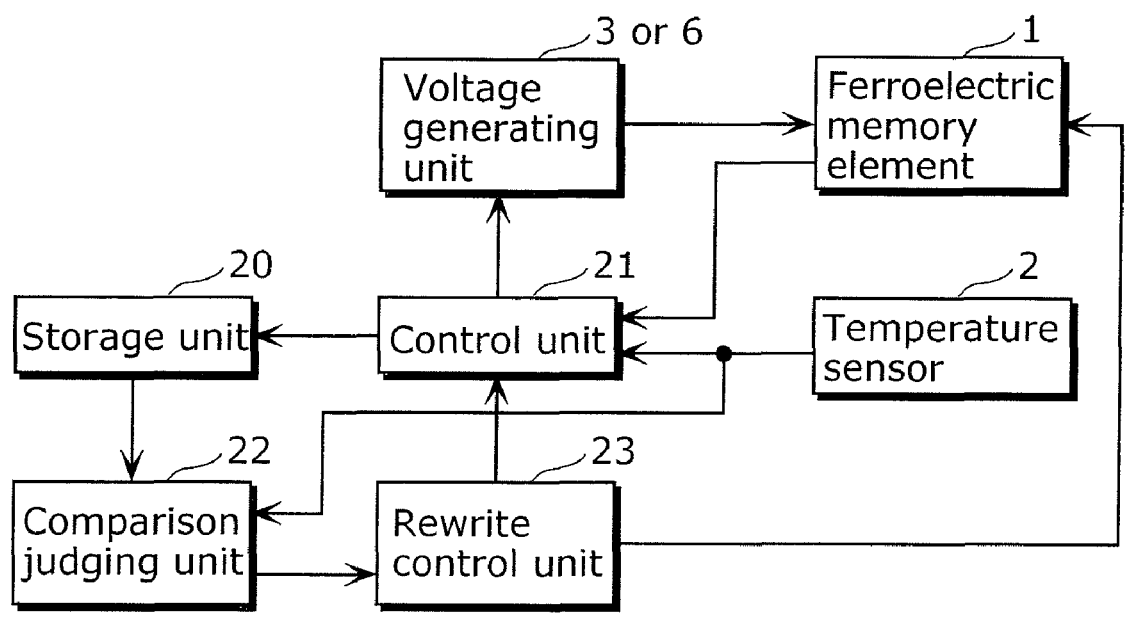
FIG. 14 is a block diagram of a ferroelectric memory apparatus according to a third embodiment.

FIG. 14 is a block diagram showing a configuration of a ferroelectric memory apparatus according to a third embodiment.

The ferroelectric memory apparatus according to the present embodiment includes the ferroelectric memory element 1, the temperature sensor 2, the voltage generating unit 3 or 6, a storage unit 20 which stores temperature and address information, a control unit 21 which variably controls the voltage generating unit 3 or 6 based on measurement results produced by the temperature sensor 2 and stores temperatures and addresses during a write operation in the storage unit 20, a comparison judging unit 22 which reads information from the storage unit 20 and compares it with the current temperature, and a rewrite control unit 23 which performs a rewrite operation based on results produced by the comparison judging unit 22.

It is assumed that the ferroelectric memory apparatus according to the present embodiment has plural ferroelectric memory elements 1 which are identified by respective addresses different from each other.

Figure 15:
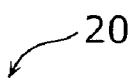
FIG. 15 is a block diagram showing an example of information retained by the ferroelectric memory apparatus according to the third embodiment, the information associating temperatures and addresses with each other.

FIG. 15 is a block diagram showing an example of information stored in the storage unit 20. The storage unit 20 stores address values which identify the ferroelectric memory elements in which data have been written and the temperatures at which the data have been written, by associating them with each other.

Next, an operation of the ferroelectric memory apparatus according to the present embodiment will be described. During a regular write or read operation, the temperature sensor 2 measures the temperature and passes the results to the control unit 21. The control unit 21 makes the voltage generating unit 3 or the voltage generating unit 6 generate the optimal write or read voltage at the current temperature, supplies it to the ferroelectric memory element 1, and stores the temperature and address for the write or read operation in the storage unit 20.

Subsequently, using a non-access time of the ferroelectric memory elements 1, the comparison judging unit 22 reads information from the storage unit and compares it with the current temperature. Then, addresses which have differences larger than a predetermined value are passed to the rewrite control unit 23, which then performs a rewrite operation using the optimal write voltage at the current temperature to recover from degradation of data retention characteristics and imprint degradation.

Consequently, since it is possible to recover from degradation of data retention characteristics and imprint degradation by rewriting data into only the ferroelectric memory element for which the recovery is required, it is possible to avoid a negative effect, i.e., shortening the life of ferroelectric memory elements by unnecessary rewrite operations.

Thus, the present embodiment provides a ferroelectric memory apparatus which can more efficiently recover the ferroelectric memory from degradation of data retention characteristics and imprint degradation and operate properly even in cold regions or in environments with severe temperature changes as well as provides a control method for the ferroelectric memory apparatus.

Fourth Embodiment

Figure 16:
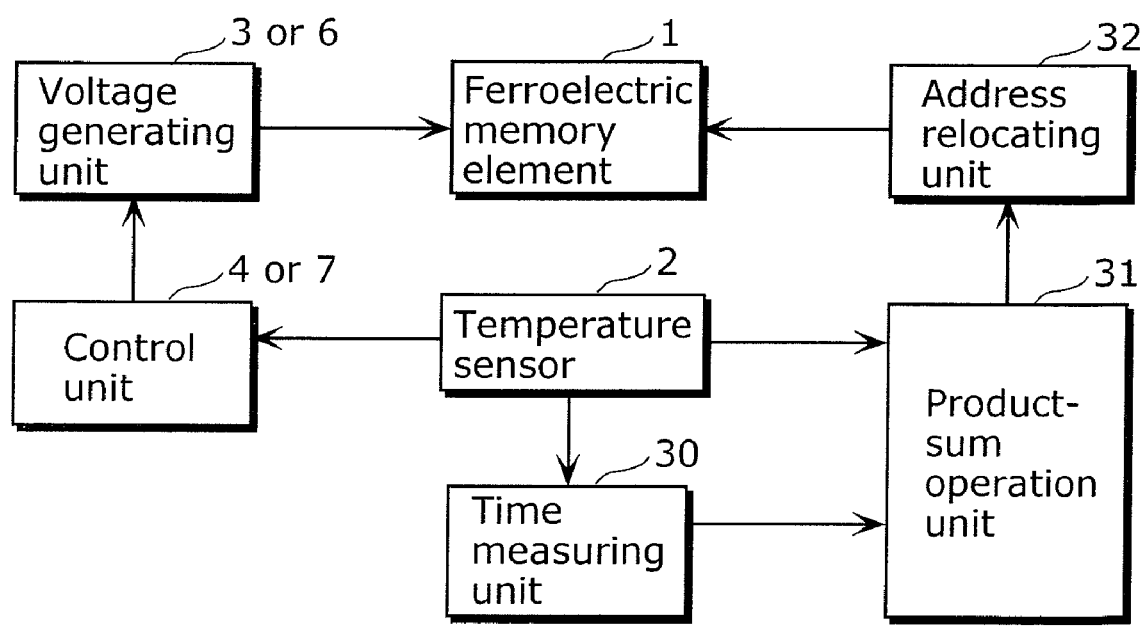
FIG. 16 is a block diagram of a ferroelectric memory apparatus according to a fourth embodiment.

FIG. 16 is a block diagram showing a configuration of a ferroelectric memory apparatus according to a fourth embodiment.

Compared to the configuration according to the first embodiment and application of the first embodiment, the configuration according to the present embodiment further includes a time measuring unit 30 which measures time, a product-sum operation unit 31 which computes a product-sum of times and temperatures, and an address relocating unit 32 which controls address relocation among the ferroelectric memory elements 1.

The term "address relocation" means the process of reading data from the ferroelectric memory element 1, writing the data in an unused ferroelectric memory element (not shown), and changing the correspondence between ferroelectric memory elements and addresses so that the new ferroelectric memory element can be identified by the address of the original ferroelectric memory element 1.

This process is also called an address relocating process. It is widely used conventionally as a technique for leveling the number of data writes among plural ferroelectric memory elements in a ferroelectric memory apparatus, and thus detailed description thereof will be omitted herein.

Next, with reference to the configuration of the present embodiment, an operation of the present embodiment will be described regarding only differences from the application of the first embodiment.

The time measuring unit 30 measures a duration of each of plural periods during which a constant temperature is detected consecutively by the temperature sensor 2. The product-sum operation unit 31 multiplies the temperature by the duration, sums the products, and thereby calculates a product-sum. When the calculated product-sum exceeds a predetermined value, the address relocating unit 32 relocates the data stored in the ferroelectric memory element 1 together with its physical address to an unused ferroelectric memory element.

When the calculated product-sum exceeds the predetermined value, it can be considered that imprint degradation has been caused by thermal stress. By relocating data to an unused ferroelectric memory cell unaffected by imprint degradation, it is possible to recover the data from imprint degradation.

Thus, the present embodiment provides a ferroelectric memory apparatus which can recover the ferroelectric memory from degradation of data retention characteristics and imprint degradation using a relatively simple configuration and operate properly even in cold regions or in environments with severe temperature changes as well as provides a control method for the ferroelectric memory apparatus.

Fifth Embodiment

Figure 17:
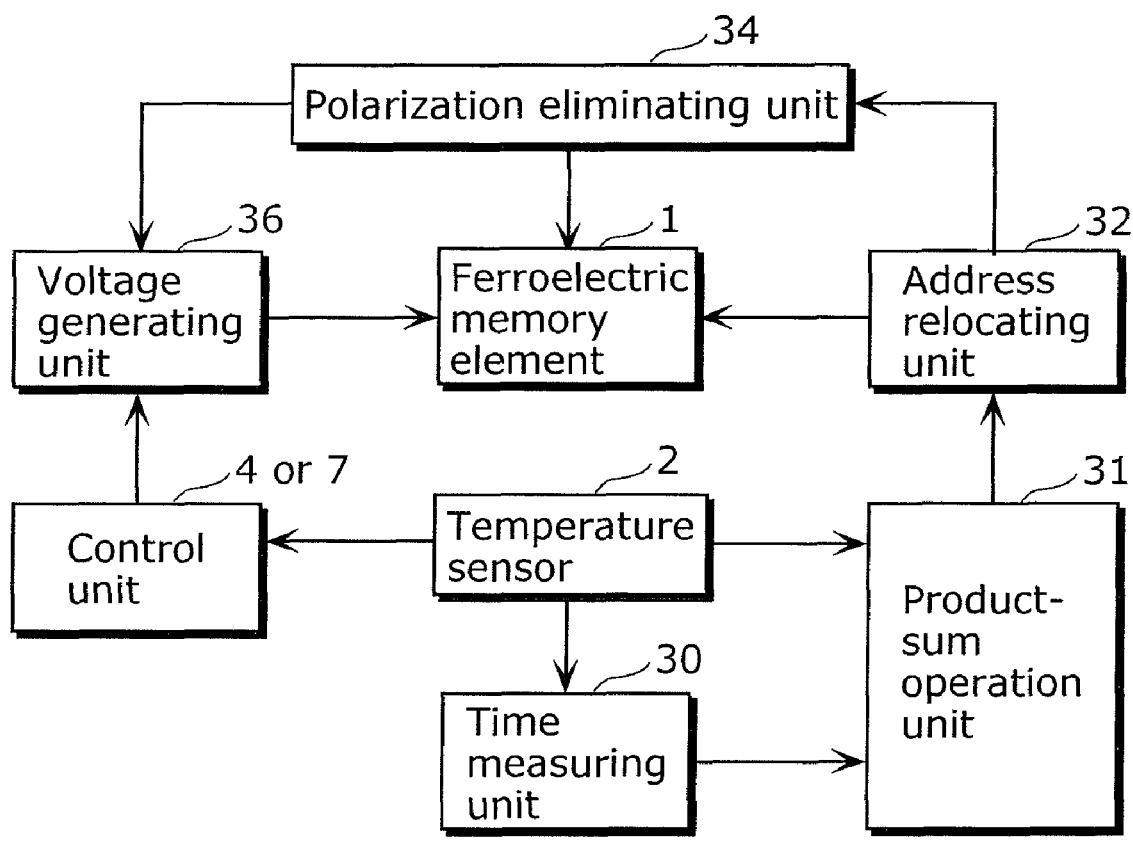
FIG. 17 is a block diagram of a ferroelectric memory apparatus according to a fifth embodiment.

FIG. 17 is a block diagram showing a configuration of a ferroelectric memory apparatus according to a fifth embodiment.

Compared to the configuration according to the fourth embodiment, the configuration according to the present embodiment further includes a polarization eliminating unit 34 which variably controls a polarization eliminating voltage, and the voltage generating unit 36 generates a voltage based on variable control of the voltage from the polarization eliminating unit 34 under the control of the control unit 4 or 7.

Next, with reference to the configuration of the present embodiment, an operation of the present embodiment will be described regarding only differences from the fourth embodiment. After the address relocating unit 32 changes the physical address of the data stored in the ferroelectric memory element 1 to an unused address, the polarization eliminating unit 34 places the original physical address in a depolarized state by writing "1" and "0" alternately while gradually lowering the write voltage by variably controlling the voltage generating unit 36, so that the polarization state of the original physical address will be neither "1" nor "0." This makes the original physical address available again as a relocation destination.

Thus, the present embodiment provides a ferroelectric memory apparatus which can recover the ferroelectric memory from degradation of data retention characteristics and imprint degradation in a simple manner any number of times and operate properly even in cold regions or in environments with severe temperature changes as well as provides a control method for the ferroelectric memory apparatus.

Application of Fifth Embodiment

Figure 18:
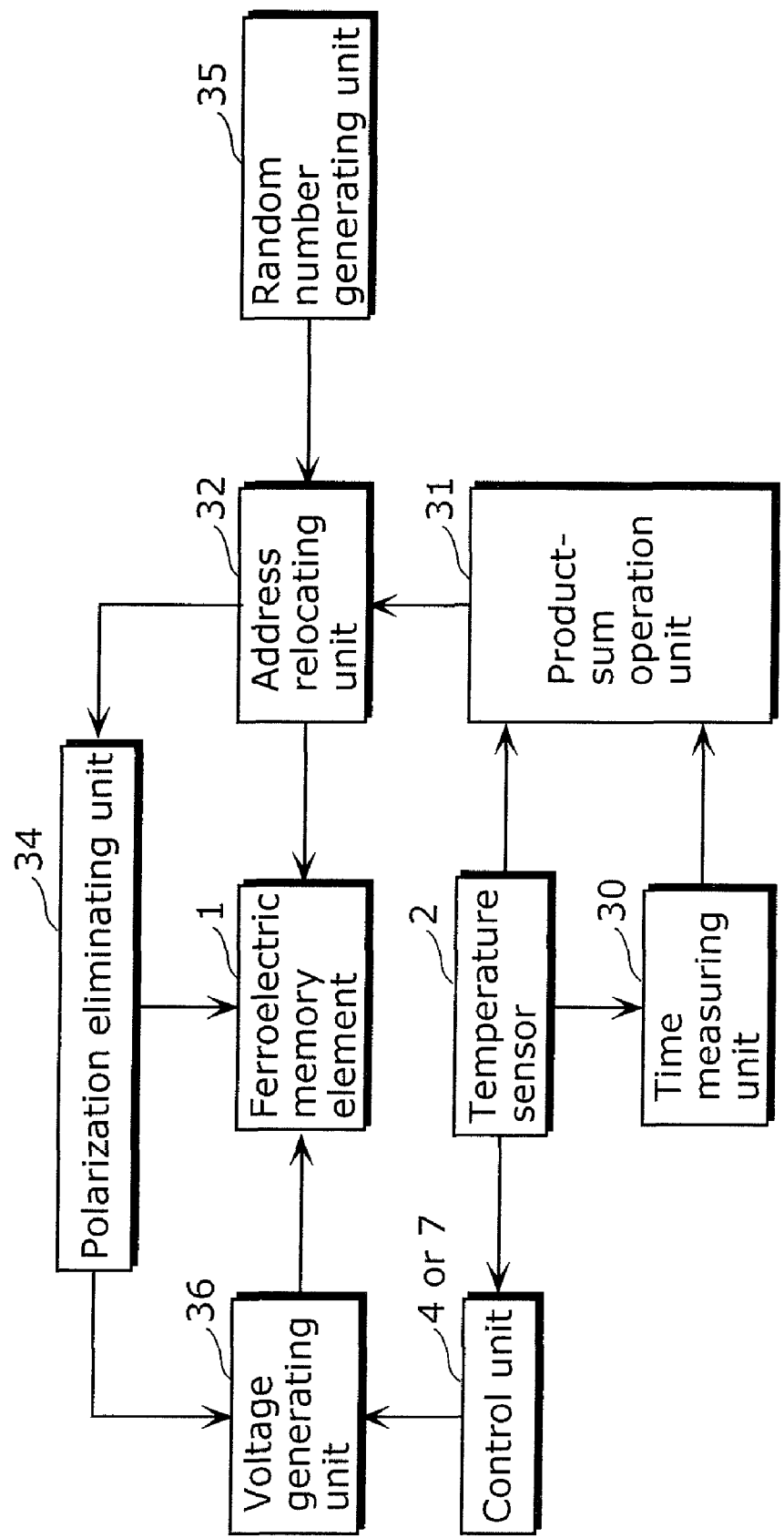
FIG. 18 is a block diagram of a ferroelectric memory apparatus according to an application of the fifth embodiment.

FIG. 18 is a block diagram showing a configuration of a ferroelectric memory apparatus according to an application of the fifth embodiment.

Compared to the configuration according to the fifth embodiment, the configuration according to the present application further includes a random number generating unit 35.

Next, with reference to the configuration of the present application, an operation of the present application will be described regarding only differences from the fifth embodiment. When relocating the data stored in the ferroelectric memory element 1 to an unused ferroelectric memory element, the address relocating unit 32 determines the ferroelectric memory element for use as a relocation destination based on a result produced by the random number generating unit 35.

Consequently, since plural ferroelectric memory elements tend to be used equally as relocation destinations, it is possible to avoid a situation in which rewrite operations would concentrate on a particular ferroelectric memory element, facilitating degradation of the given ferroelectric memory element and consequently shortening the life of the entire ferroelectric memory apparatus.

Thus, the present application provides a ferroelectric memory apparatus which can perform the process of recovering the ferroelectric memory from degradation of data retention characteristics and imprint degradation a larger number of times and operate properly even in cold regions or in environments with severe temperature changes as well as provides a control method for the ferroelectric memory apparatus.

Sixth Embodiment

Figure 19:
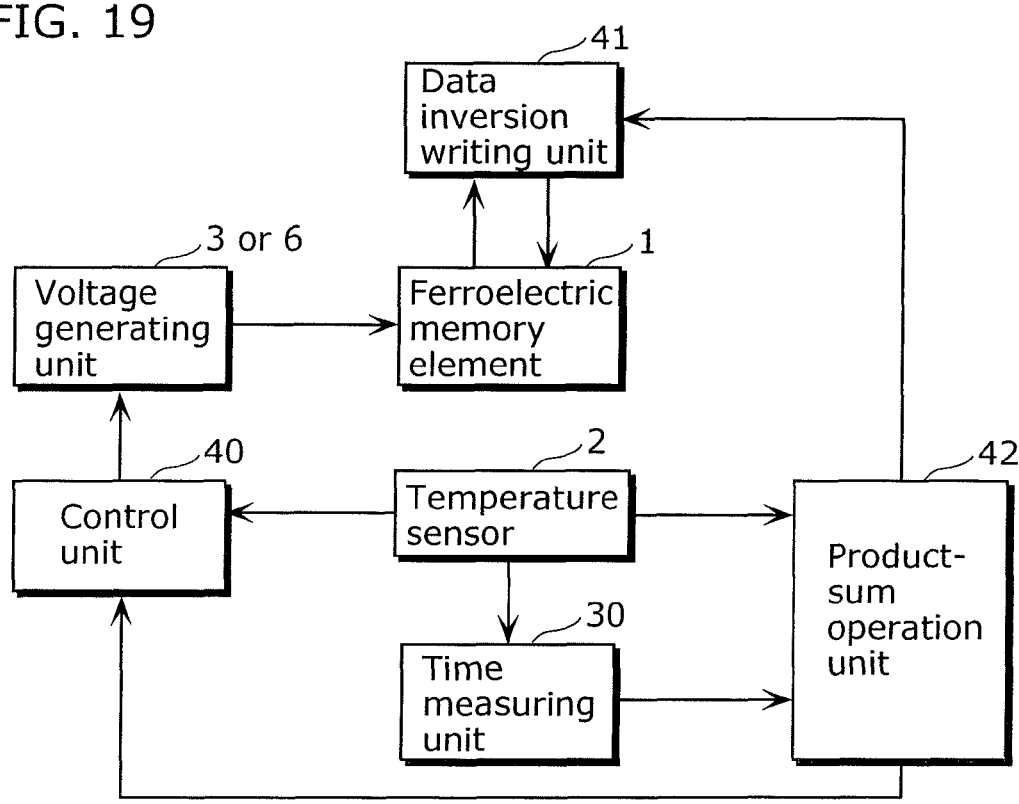
FIG. 19 is a block diagram of a ferroelectric memory apparatus according to a sixth embodiment.

FIG. 19 is a block diagram showing a configuration of a ferroelectric memory apparatus according to a sixth embodiment.

The ferroelectric memory apparatus according to the present embodiment includes the ferroelectric memory element 1; the time measuring unit 30; the temperature sensor 2; a product-sum operation unit 42; and a control unit 40 which variably controls values of the voltage generated by the voltage generating unit 3 or 6 based on results produced by the temperature sensor 2 and the product-sum operation unit 42; and a data inversion writing unit 41 which reads data from the ferroelectric memory, invert the data, and writes again the inverted data based on results produced by the product-sum operation unit 42.

The product-sum operation unit 42 has a function to calculates a product-sum as in the case of the product-sum operation unit 31 and then determine voltage and time to be supplied to the ferroelectric memory element 1 to cancel out, at the temperature currently detected by the temperature sensor 2, changes in characteristics of the ferroelectric memory element 1 likely to have been caused by thermal stress corresponding to the calculated product-sum.

The product-sum operation unit 42 finds the voltage and time needed to impart the given amount of thermal stress to the ferroelectric memory element 1 at the current temperature. For that, as an example, the product-sum operation unit 42 may internally record voltage values and times by associating them with product-sums and temperatures for future reference.

Next, with reference to the configuration of the present embodiment, an operation of the present embodiment will be described. Regular access operations to the ferroelectric memory element 1 are the same as the first embodiment, and thus only differences will be described here. When the thermal stress value calculated by the product-sum operation unit 42 exceeds the value at which the imprint degradation to recover from is considered to have occurred, the data inversion writing unit 41 writes inverted data during a non-access time of the ferroelectric memory element 1 until the same level of stress as the thermal stress suffered before the inversion is imposed, and thereby recovers from the imprint degradation.

In so doing, the product-sum operation unit 42 determines, from the current temperature, the voltage and time needed to impose thermal stress equivalent to the thermal stress before the inversion and informs the control unit 40 of the voltage value so that the control unit 40 will variably control the voltage generating unit 3 or 6. On the other hand, the time determined by the product-sum operation unit 42 is sent to the data inversion writing unit 41, which then translates the time into the number of writes and writes the inverted data continuously to recover from the imprint degradation. Finally, the inverted data is reset to the original data and is then written again.

This obviates the need for redundant memory capacity and polarization elimination. Also, by increasing the voltage value and decreasing the number of writes, the present embodiment provides an advantage in terms of the life of the ferroelectric memory element.

Thus, the present embodiment provides a ferroelectric memory apparatus which can recover the ferroelectric memory from degradation of data retention characteristics and imprint degradation and operate properly even in cold regions or in environments with severe temperature changes as well as provides a control method for the ferroelectric memory apparatus.

Seventh Embodiment

Figure 20:
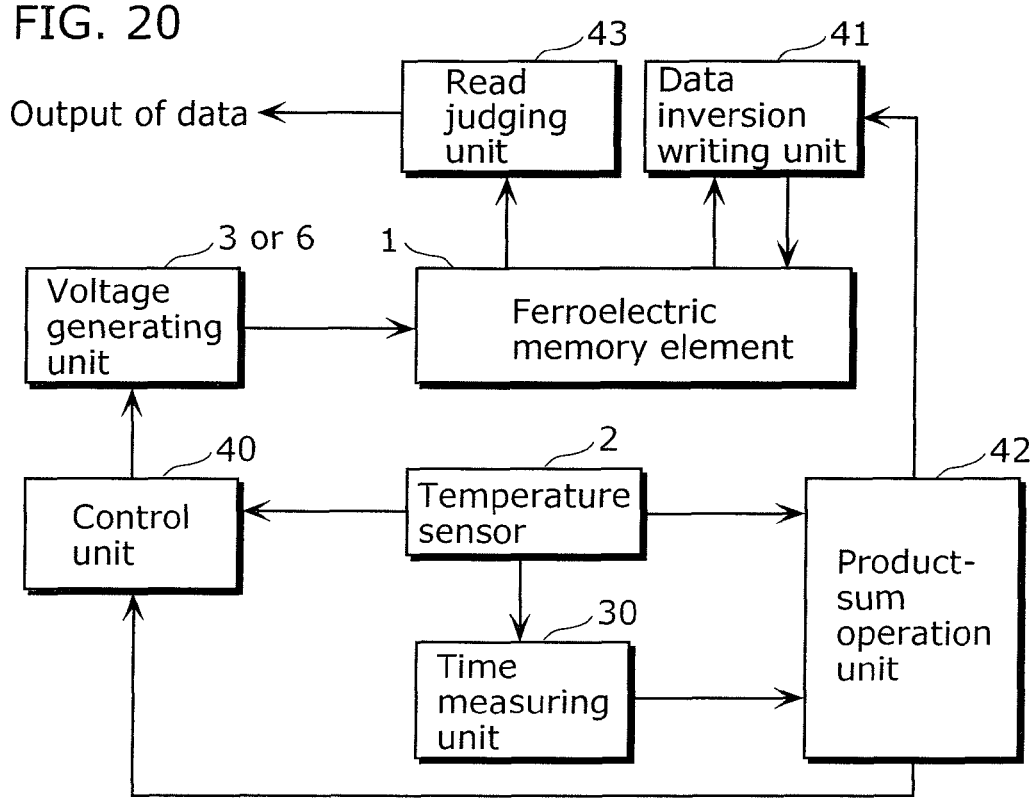
FIG. 20 is a block diagram of a ferroelectric memory apparatus according to a seventh embodiment.

FIG. 20 is a block diagram showing a configuration of a ferroelectric memory apparatus according to a seventh embodiment.

Compared to the configuration according to the sixth embodiment, the configuration according to the present embodiment further includes a read judging unit 43. Also, it further includes a ferroelectric memory element for retaining an indicator bit which indicates whether the ferroelectric memory element 1 retains original data or inverted data.

Next, with reference to the configuration of the present embodiment, an operation of the present embodiment will be described regarding only differences from the sixth embodiment.

Figure 21:
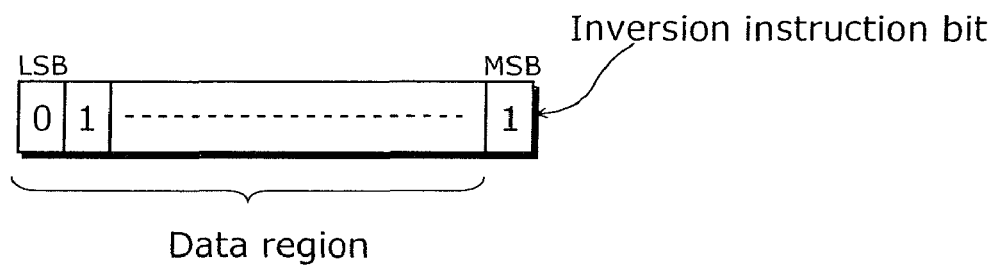
FIG. 21 is a diagram showing a configuration of data stored in a ferroelectric memory according to the seventh embodiment.

FIG. 21 shows an example of a configuration of data stored in the ferroelectric memory apparatus according to the present embodiment. The ferroelectric memory apparatus according to the present embodiment has plural ferroelectric memory elements 1. Each bit of data is stored in an appropriate ferroelectric memory element and an inversion indicator bit is stored in another ferroelectric memory element.

When each original bit of the data is written, "0" is written in the inversion indicator bit. The data bits and inversion indicator bit are written all at once in inverted form under the control of the data inversion writing unit 41.

When outputting data in response to an external read request, the read judging unit 43 judges content of the inversion indicator bit before data output. For example, when the inversion indicator bit is "0," the read judging unit 43 outputs the data as they are. However, when the inversion indicator bit is "1," the read judging unit 43 outputs the data after inverting it and resetting it to the original value. Incidentally, the definitions of "0" and "1" may be interchanged.

This makes it possible to respond the original data in response to an external read request even when inverted data is retained for the purpose of recovery from imprint degradation. This in turn makes it possible to streamline the design of an entire system which uses the ferroelectric memory apparatus.

Thus, the present embodiment provides a ferroelectric memory apparatus which can recover the ferroelectric memory elements from degradation of data retention characteristics and imprint degradation and operate properly even in cold regions or in environments with severe temperature changes as well as provides a control method for the ferroelectric memory apparatus.

Eighth Embodiment

Figure 22:
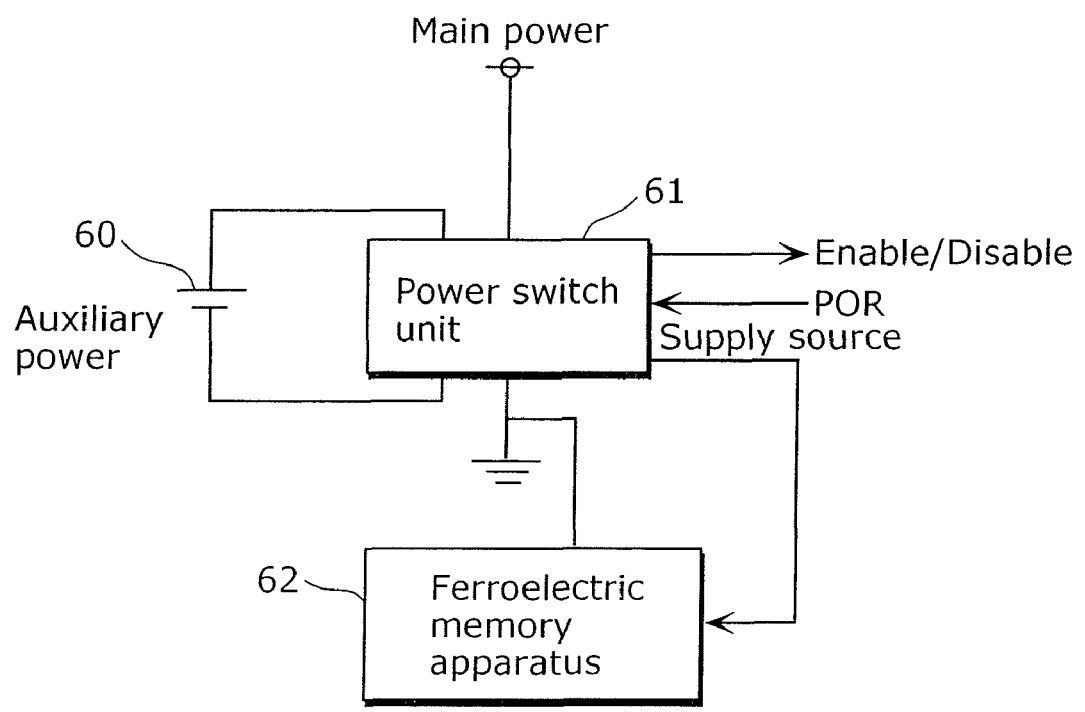
FIG. 22 is a block diagram of a ferroelectric memory apparatus according to an eighth embodiment.

FIG. 22 is a block diagram showing a configuration of a ferroelectric memory apparatus according to an eighth embodiment.

The ferroelectric memory apparatus 62 according to the present embodiment is the ferroelectric memory apparatus according to any one of the second to seventh embodiments, but further includes an auxiliary power supply 60 which is a battery, and a power switch unit 61 which supplies power to the ferroelectric memory apparatus 62 by switching between main power supply and auxiliary power supply.

When no power is supplied from the main power supply, the power switch unit 61 supplies operating power of the ferroelectric memory apparatus from the auxiliary power supply 60.

Next, with reference to the configuration of the present embodiment, an operation of the present embodiment will be described regarding only differences from the second to seventh embodiments. When the main power supply is off, the power switch unit 61 and ferroelectric memory apparatus 62 operate on the auxiliary power supply while at the same time the power switch unit 61 watches the main power supply.

When the main power supply is turned on, the power switch unit 61 switches from the auxiliary power supply to the main power supply when potential of the main power supply which is watched by the power switch unit 61 reaches or exceeds a predetermined threshold (potential high enough to drive the apparatus) and a Power-on-Reset (POR) signal which has been received from an upper level apparatus is removed. Until the potential of the main power supply rises to a sufficient level, the power switch unit 61 outputs a Disable signal to the upper level apparatus to disable access to the ferroelectric memory. When the potential reaches a sufficient level, the power switch unit 61 outputs an Enable signal to the upper level apparatus to enable access.

When the main power supply is turned off, if potential of the watched main power supply falls to a turn-off threshold, the power switch unit 61 outputs a Disable signal to the upper level apparatus to disable access to the ferroelectric memory and switches from the main power supply to the auxiliary power supply. When the potential of the auxiliary power supply reaches a sufficient level, the power switch unit 61 outputs an Enable signal to the upper level apparatus to enable access.

Alternatively, a secondary battery may be used as the auxiliary power supply 60 and the power switch unit 61 may be additionally equipped with a function to charge the auxiliary power supply 60 when power is being supplied from the main power supply.

This makes it possible to maintain data retention characteristics, recover from imprint degradation, and prevent data loss even if the ferroelectric memory apparatus is kept in storage or left unused for a long period of time.

Thus, the present embodiment provides a ferroelectric memory apparatus which can recover the ferroelectric memory from degradation of data retention characteristics and imprint degradation and operate properly even in cold regions or in environments with severe temperature changes or after a long-term neglect as well as provides a control method for the ferroelectric memory apparatus.

Ninth Embodiment

Figure 23:
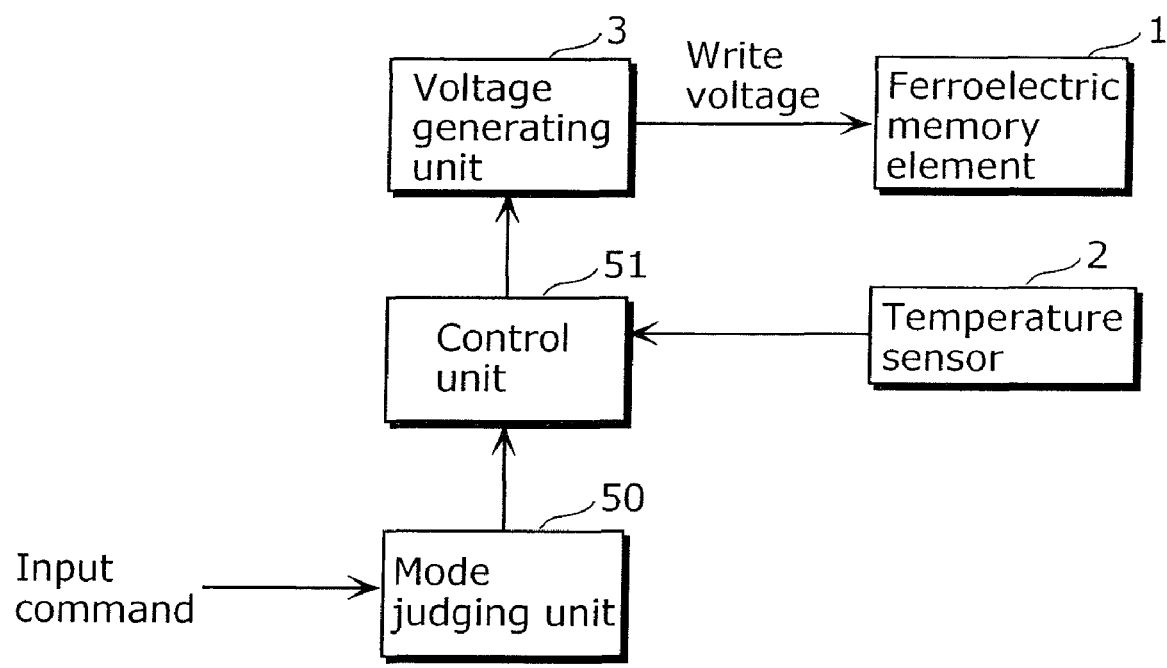
FIG. 23 is a block diagram of a ferroelectric memory apparatus according to a ninth embodiment.

FIG. 23 is a block diagram showing a configuration of a ferroelectric memory apparatus according to a ninth embodiment.

Compared to the configuration according to the first embodiment, the configuration according to the present embodiment further includes a mode judging unit 50 which judges an operation mode in response to an operation mode command, and a control unit 51.

Compared to the control unit 4, the control unit 51 further includes a function to variably control the voltage generating unit 3 based on results produced by the mode judging unit 50.

Next, with reference to the configuration of the present embodiment, an operation of the present embodiment will be described regarding only differences from the first embodiment. After the mode judging unit 50 determines an operation mode in response to an operation mode command, the control unit 51 switches from variable voltage value control based on temperature to control using a predetermined voltage value unique to the operation mode.

This allows an operation specific to each operation mode. Also, since the present embodiment can be implemented by adding the mode judging unit 50 and its ferroelectric memory apparatus to any of the embodiments described above, it can provide a ferroelectric memory apparatus incorporating the present embodiment easily at low cost.

Thus, the present embodiment can provide a more practical apparatus adaptable to an application unique to a specific operation mode, such as accelerated stress testing in inspection mode.

Also, the control methods for recovery from imprint degradation described in the fourth to eighth embodiments are useful for apparatus equipped with a ferroelectric memory apparatus for any application.

Furthermore, most of the control units and operation units described above in any of the embodiments can be implemented using a microcomputer. Also, the temperature sensor 2, time measuring unit 30, and condensation sensor 11 are the same as those mounted in most electrical appliances. Thus, a practical ferroelectric memory apparatus and control method thereof can be provided more easily at lower cost.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The ferroelectric memory apparatus and control method according to the present invention can be applied to any electronic equipment that uses a memory apparatus. Especially, they can be suitably applied to electronic equipment which is required to assure an operation in a wide temperature range because it is used outdoors on the go in cold regions.

What is claimed is:

1. A ferroelectric memory apparatus which stores data, said ferroelectric memory apparatus comprising:
   a ferroelectric memory;
   a temperature sensor which detects a temperature of said ferroelectric memory apparatus;
   a controller operable to output a control signal indicating a voltage, the voltage increasing as the temperature detected by said temperature sensor decreases, and the voltage decreasing as the temperature detected by said temperature sensor increases; and
   a voltage generator operable to generate the voltage indicated by the control signal outputted by said controller, and to supply the generated voltage to said ferroelectric memory,
   wherein said controller is operable to output the control signal only when said temperature sensor detects a temperature that exceeds a temperature range within which a write operation and a read operation can be assured using a fixed voltage, and
   wherein the ferroelectric memory writes and reads data using a fixed voltage when said temperature sensor detects a temperature that is within the temperature range within which a write operation and a read operation can be assured using a fixed voltage.

2. The ferroelectric memory apparatus according to claim 1,
wherein said ferroelectric memory includes a ferroelectric capacitor and a transistor, and
said voltage generator is operable to apply the generated voltage to said ferroelectric capacitor via said transistor as an operating voltage for writing and reading data, and to generate a control voltage for controlling said transistor to supply the control voltage to said transistor.

3. The ferroelectric memory apparatus according to claim 1,
wherein said controller is operable to control said voltage generator to generate a voltage which varies in a stepwise manner according to a variation of the temperature detected by said temperature sensor.

4. The ferroelectric memory apparatus according to claim 1, further comprising:
a rewrite controller operable to perform, in said ferroelectric memory, a rewrite control during a period when neither a write operation nor a read operation of data is performed according to a command issued from outside said ferroelectric memory apparatus, the rewrite control being reading of the data from said ferroelectric memory and then rewriting of the read data into said ferroelectric memory.

5. The ferroelectric memory apparatus according to claim 4,
wherein said rewrite controller stores a threshold value of temperatures detected by said temperature sensor and voltage values corresponding to the temperatures, and is operable to indicate, to said voltage generator, a voltage value which is stored and corresponds to a temperature to be detected after the temperature detected by said temperature sensor exceeds the stored threshold value, and
said voltage generator is operable to supply, to said ferroelectric memory, a voltage generated according to an indication from said rewrite controller as an operating voltage for rewriting data.

6. The ferroelectric memory apparatus according to claim 4, further comprising:
a condensation sensor which detects condensation occurring from said ferroelectric memory apparatus, and
wherein said rewrite controller is operable to perform rewrite control when said condensation sensor detects the condensation.

7. The ferroelectric memory apparatus according to claim 4, further comprising:
plural ferroelectric memories;
a storer which stores the temperature detected by said temperature sensor and an address that identifies one of said plural ferroelectric memories in which data has been written and read, when the data is written into and read from one of said plural ferroelectric memories; and
a comparison determiner operable to compare a difference between a temperature newly detected by said temperature sensor and the temperature stored in said storer, and to judge whether the difference of the temperatures exceeds a predetermined value;
wherein said rewrite controller is operable to perform a rewrite control on the data stored in said one of said plural ferroelectric memories identified by the address stored in said storer, when said comparison determiner judges that the difference exceeds the predetermined value.

8. The ferroelectric memory apparatus according to claim 1, further comprising:
plural ferroelectric memories;
a time measurer;
a product-sum operator operable to calculate a product-sum of times measured by said time measurer and temperatures detected by said temperature sensor; and
a relocator operable to read data from at least one of said plural ferroelectric memories after said product-sum operator calculates the product-sum which exceeds a predetermined value, and to write the read data into one of said plural ferroelectric memories which is not used.

9. The ferroelectric memory apparatus according to claim 8, further comprising:
a polarization eliminator operable to eliminate a polarization amount in said ferroelectric memory in which the data has been read, after said relocator executes reading of the data and writing of the read data.

10. The ferroelectric memory apparatus according to claim 9, further comprising:
a random number generator,
wherein said relocator is operable to determine, based on a random number generated by said random number generator, one of said plural ferroelectric memories into which the data is to be written, and to write the data into said one of said plural ferroelectric memories which has been determined by said relocator.

11. The ferroelectric memory apparatus according to claim 1, further comprising:
a time measurer;
a product-sum operator operable to calculate a product-sum of time measured by said time measurer and the temperature detected by said temperature sensor; and
a data inversion writer operable to read data from said ferroelectric memory after said product-sum operator calculates the product-sum which exceeds a predetermined value, and to perform inversion writing control which inverts the read data and writes the data into said ferroelectric memory.

12. The ferroelectric memory apparatus according to claim 11,
wherein said product-sum operator is operable to calculate a voltage and time that should be supplied to said ferroelectric memory to cancel, under the temperature detected by said temperature sensor, a variation of a characteristic which is assumed to occur in said ferroelectric memory according to the calculated product-sum of the time and temperature, when said data inversion writer performs inversion writing control on the data, and
said controller is operable to control said voltage generator so as to supply the voltage calculated by said product-sum operator to said ferroelectric memory for the calculated time.

13. The ferroelectric memory apparatus according to claim 11, further comprising:
an other ferroelectric memory which stores indication data,
wherein said data inversion writer is operable to perform the inversion writing control, to read the indication data from said other ferroelectric memory, to inverse the read indication data, and to write the data into said other ferroelectric memory, and
said ferroelectric memory apparatus further comprising:
a read determiner operable to read the data from said ferroelectric memory, to read the indication data from said other ferroelectric memory, to judge whether the data is inversed based on the indication data, and to inverse the read data or to output the read data outside said ferroelectric memory apparatus without inversing the data, depending on a result of the judgment.

14. The ferroelectric memory apparatus according to claim 1, further comprising:
an auxiliary power supply which is a battery; and
a power switcher operable to supply an operating power of said ferroelectric memory apparatus from said auxiliary power supply, when power is not supplied from outside said ferroelectric memory apparatus.

15. The ferroelectric memory apparatus according to claim 1, further comprising:
a mode determiner operable to judge whether said ferroelectric memory apparatus is operated in a first mode or a second mode according to a command issued from outside said ferroelectric memory apparatus,
wherein said controller is operable to control said voltage generator to generate a voltage according to the temperature detected by said temperature sensor when said mode determiner judges the first mode, and to generate a voltage having a predetermined fixed value when said mode determiner judges the second mode.

16. A control method of a ferroelectric memory apparatus which stores data using a ferroelectric memory, said method comprising:
detecting a temperature of the ferroelectric memory apparatus;
outputting a control signal indicating a voltage, the voltage increasing as the temperature detected in said detecting decreases, and the voltage decreasing as the temperature detected in said detecting increases; and
generating the voltage indicated by the control signal which is outputted in said outputting, and supplying the generated voltage to the ferroelectric memory,
wherein the control signal is outputted in said outputting, only when a temperature that exceeds a temperature range within which a write operation and a read operation can be assured using a fixed voltage, and
wherein the ferroelectric memory writes and reads data using a fixed voltage when the temperature sensor detects a temperature that is within the temperature range within which a write operation and a read operation can be assured using a fixed voltage.

17. The control method of the ferroelectric memory apparatus according to claim 16,
wherein the ferroelectric memory apparatus includes an auxiliary power supply, which is a battery, and
said control method further comprises:
supplying an operating power of the ferroelectric memory apparatus from the auxiliary power supply, when power supplied from outside the ferroelectric memory apparatus does not exceed a predetermined threshold.

* * * * *